US007688108B2

(12) United States Patent
Hong et al.

(10) Patent No.: US 7,688,108 B2
(45) Date of Patent: Mar. 30, 2010

(54) METHOD FOR MINIMIZING DATA TRANSITION AND CIRCUIT FOR MINIMIZING DATA TRANSITION

(75) Inventors: Jin Cheol Hong, Gyeongsangbuk-do (KR); Soon Dong Cho, Gyeongsangbuk-do (KR); Jeong Ho Kang, Gyeongsangbuk-do (KR); Hyun Chul Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/318,559

(22) Filed: Dec. 31, 2008

(65) Prior Publication Data

US 2010/0027910 A1 Feb. 4, 2010

(30) Foreign Application Priority Data

Aug. 4, 2008 (KR) ..................... 10-2008-0076214

(51) Int. Cl.
*H03K 19/21* (2006.01)

(52) U.S. Cl. ........................................ 326/54; 382/275

(58) Field of Classification Search .................. 326/54, 326/52, 46; 382/275

See application file for complete search history.

(56) References Cited

U.S. PATENT DOCUMENTS 7,382,345 B2 * 6/2008 Hong .......................... 345/99
7,557,792 B2 * 7/2009 Hong .......................... 345/99
2008/0129903 A1 * 6/2008 Hong et al. .................... 349/36
2008/0129904 A1 * 6/2008 Kang et al. .................... 349/37

* cited by examiner

*Primary Examiner*—Daniel D Chang
(74) *Attorney, Agent, or Firm*—Holland & Knight LLP

(57) ABSTRACT

A data transition minimization method includes exclusive-NORing inputted nth image data (where n is a natural number) and (n−m)th image data (where m is a natural number smaller than n) expressing the same color as that of the nth image data to generate transition information data; generating inversion data indicative of inversion information by inverting all bits included in the transition information data and adding a unit bit having the logic value '1' to the inverted transition information data when the number of unit bits having a logic value '1' in the transition information data is larger than the number of unit bits having a logic value '0' in the transition information data, and adding a unit bit having the logic value '0' to the transition information data when the number of unit bits having the logic value '1' in the transition information data is equal to or smaller than the number of unit bits having the logic value '0' in the transition information data; exclusive-NORing the transition information data with the inversion data added and corrected image data of (n−1)th image data to generate corrected image data of the nth image data, and supplying the generated corrected image data to a data driver through data transmission lines; and restoring the corrected image data supplied to the data driver to restored image data corresponding to the original nth image data.

8 Claims, 11 Drawing Sheets

METHOD FOR MINIMIZING DATA TRANSITION AND CIRCUIT FOR MINIMIZING DATA TRANSITION

This application claims the benefit of the Korean Patent Application No. 10-2008-076214, filed on Aug. 4, 2008, which is hereby incorporated by reference as if fully set forth herein.

BACKGROUND OF THE INVENTION

1. Field of the Invention

The present invention relates to a method for minimizing a data transition, and more particularly, to a data transition minimization method and a data transition minimization circuit which can minimize a transition between data having different color information.

2. Discussion of the Related Art

A conventional data transition minimization method is adapted to perform a comparison between two data which are outputted adjacent to each other in time and determine based on the comparison result whether to invert data to be currently outputted.

However, in the case where the conventional method is applied to a display device which consecutively outputs data having different color information, little transition reduction effect can be seen.

SUMMARY OF THE INVENTION

Accordingly, the present invention is directed to a data transition minimization method and a data transition minimization circuit that substantially obviate one or more problems due to limitations and disadvantages of the related art.

An object of the present invention is to provide a data transition minimization method and a data transition minimization circuit which can, based on a characteristic that little transition occurs between image data having the same color information, perform a comparison between those image data, generate transition information data based on the comparison result and modulate and restore image data to be currently outputted, based on the generated transition information data, so as to minimize a transition between image data which are transmitted from a timing controller to a data driver.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a data transition minimization method includes a) exclusive-NORing inputted nth image data (where n is a natural number) and (n−m)th image data (where m is a natural number smaller than n) expressing the same color as that of the nth image data to generate transition information data; b) when the number of unit bits having a logic value ‘1’ included in the transition information data is larger than the number of unit bits having a logic value ‘0’ included in the transition information data, inverting logics of all bits included in the transition information data and adding a unit bit having the logic value ‘1’ to the inverted transition information data as inversion data indicative of inversion information, and, when the number of unit bits having the logic value ‘1’ included in the transition information data is equal to smaller than the number of unit bits having the logic value ‘0’ included in the transition information data, adding a unit bit having the logic value ‘0’ to the transition information data as the inversion data; c) exclusive-NORing the transition information data with the inversion data added and corrected image data of (n−1)th image data to generate corrected image data of the nth image data, and supplying the generated corrected image data to a data driver through data transmission lines; and d) restoring the corrected image data supplied to the data driver to restored image data corresponding to the original nth image data.

At the step d), the corrected image data of the nth image data may be restored to the nth image data using the corrected image data of the nth image data, the (n−1)th image data and the corrected image data of the (n−1)th image data.

The step d) may include e) exclusive-NORing the corrected image data supplied at the step c) and the corrected image data of the (n−1)th image data to generate inverse transition information data; f) when inversion data of the inverse transition information data has the logic value ‘1’, inverting logics of all bits of the inverse transition information data and removing the inversion data from the inverse transition information data, and, when the inversion data has the logic value ‘0’, maintaining the logics of all the bits of the inverse transition information data as they are and removing the inversion data from the inverse transition information data; and g) exclusive-NORing the resulting inverse transition information data at the step f) and the (n−m)th image data to restore the restored image data corresponding to the original nth image data.

The image data may be any one of red image data having information about a red image, green image data having information about a green image and blue image data having information about a blue image.

The image data may be outputted in the order of red image data, green image data and blue image data and sequentially supplied to the data driver, and the m may be a multiple of 3.

In another aspect, a data transition minimization circuit includes a transition information generator for exclusive-NORing inputted nth image data (where n is a natural number) and (n−m)th image data (where m is a natural number smaller than n) expressing the same color as that of the nth image data to generate transition information data; a data inverter for, when the number of unit bits having a logic value ‘1’ included in the transition information data from the transition information generator is larger than the number of unit bits having a logic value ‘0’ included in the transition information data, inverting logics of all bits included in the transition information data and adding a unit bit having the logic value ‘1’ to the inverted transition information data as inversion data indicative of inversion information, and, when the number of unit bits having the logic value ‘1’ included in the transition information data is equal to smaller than the number of unit bits having the logic value ‘0’ included in the transition information data, adding a unit bit having the logic value ‘0’ to the transition information data as the inversion data; a data corrector for exclusive-NORing the resulting transition information data from the data inverter and corrected image data of (n−1)th image data to generate corrected image data of the nth image data, and supplying the generated corrected image data through data transmission lines; and a data driver for restoring the corrected image data, supplied from the data corrector through the data transmission lines, to restored image data corresponding to the original nth image data.

The data driver may comprise a data restoration circuit, the data restoration circuit comprising: a data inverse corrector for exclusive-NORing the corrected image data from the data corrector and the corrected image data of the (n−1)th image data to generate inverse transition information data; a data inverse inverter for, when inversion data of the inverse transition information data from the data inverse corrector has the logic value ‘1’, inverting logics of all bits of the inverse transition information data and removing the inversion data from the inverse transition information data, and, when the inversion data has the logic value ‘0’, maintaining the logics of all the bits of the inverse transition information data as they are and removing the inversion data from the inverse transition information data; and a data restorer for exclusive-NORing the resulting inverse transition information data from the data inverse inverter and the (n−m)th image data to restore the restored image data corresponding to the original nth image data.

The data transition minimization circuit may further include a first memory for storing the (n−m)th image data and supplying the (n−m)th image data to the transition information generator; a second memory for storing the corrected image data of the (n−1)th image data and supplying the corrected image data of the (n−1)th image data to the data corrector; a third memory for storing the corrected image data of the (n−1)th image data and supplying the corrected image data of the (n−1)th image data to the data inverse corrector; and a fourth memory for storing the (n−m)th image data and supplying the (n−m)th image data to the data restorer.

It is to be understood that both the foregoing general description and the following detailed description of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

Figure 1:
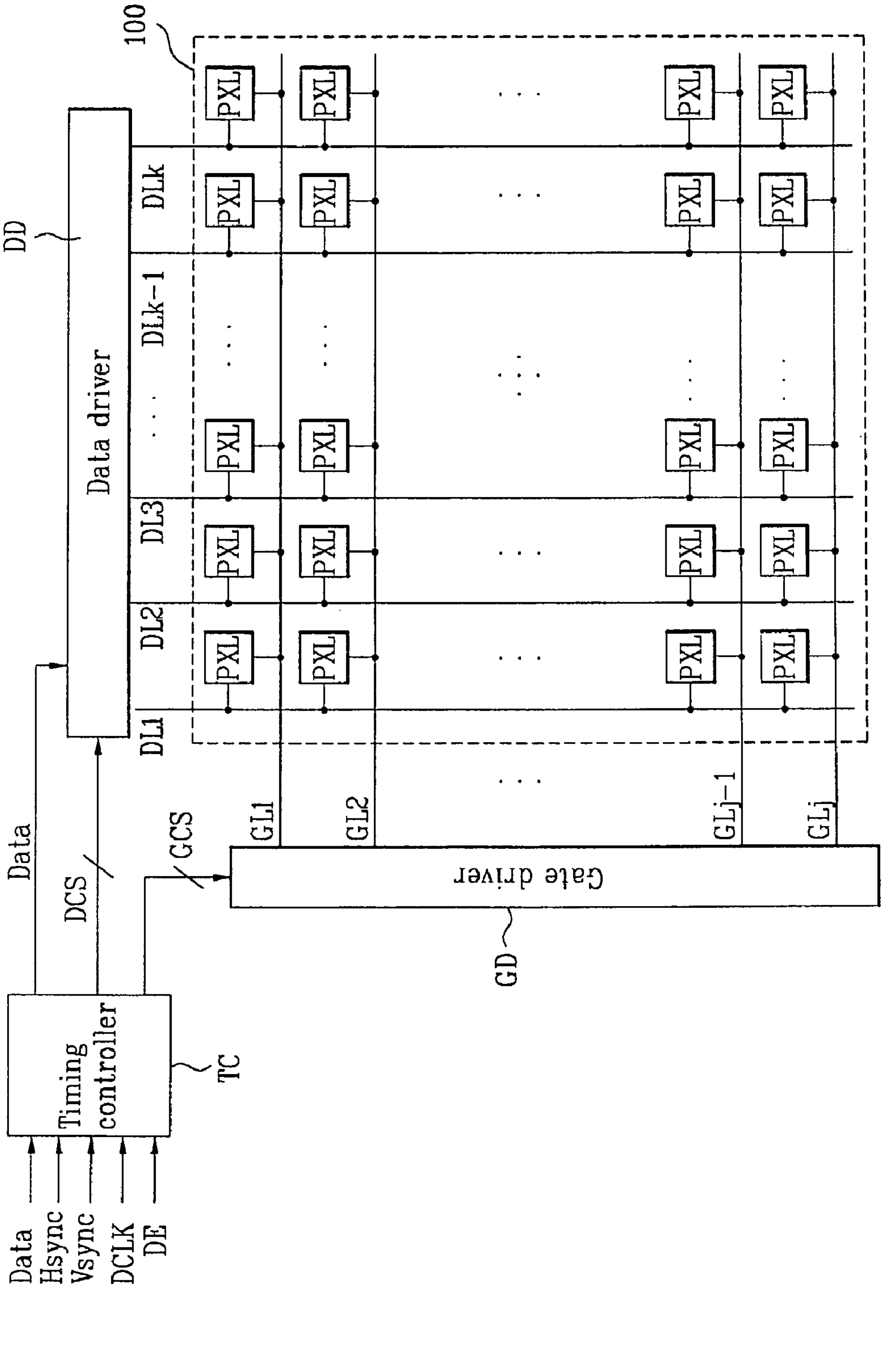
FIG. 1 is a schematic view of a liquid crystal display device according to an embodiment of the invention.

FIG. 1 is a schematic view of a liquid crystal display device according to an embodiment of the invention. The display device according to this embodiment comprises, as shown in FIG. 1, a liquid crystal panel 100 for displaying an image, a data driver DD for supplying data signals to the liquid crystal panel 100, a gate driver GD for supplying scan pulses to the liquid crystal panel 100, and a timing controller TC for generating various signals required for driving of the data driver DD and gate driver GD to control the data driver DD and gate driver GD.

The liquid crystal panel 100 includes a plurality of gate lines GL1 to GLj (where j is a natural number) arranged in one direction, a plurality of data lines DL1 to DLk (where k is a natural number) arranged to intersect the gate lines GL1 to GLj, and a plurality of pixel cells PXL formed respectively in pixel areas defined by the gate lines GL1 to GLj and the data lines DL1 to DLk. Among the plurality of pixel cells PXL, pixel cells PXL connected to a (3c+1)th (where c is a natural number) one of the data lines are red pixel cells PXL each expressing a red image, pixel cells PXL connected to a (3c+2)th one of the data lines are green pixel cells PXL each expressing a green image, and pixel cells PXL connected to a (3c+3)th one of the data lines are blue pixel cells PXL each expressing a blue image. Adjacent red pixel cell PXL, green pixel cell PXL and blue pixel cell PXL constitute a unit pixel expressing one unit image.

The (3c+1)th data line transmits a red image data voltage corresponding to the red image, the (3c+2)th data line transmits a green image data voltage corresponding to the green image, and the (3c+3)th data line transmits a blue image data voltage corresponding to the blue image.

Although not shown in FIG. 1, each pixel cell PXL includes a thin film transistor for switching a data signal (data voltage) from a corresponding data line in response to a scan pulse from a corresponding gate line, a pixel electrode for receiving the data signal switched by the thin film transistor, a common electrode for receiving an external common voltage, and a liquid crystal cell formed between the pixel electrode and the common electrode for adjusting a light transmittance based on a difference voltage (pixel voltage) between the data voltage and the common voltage.

The timing controller TC rearranges image data Data from a system (not shown), which are digital video data, suitably for the liquid crystal panel 100 and supplies the rearranged image data to the data driver DD. Also, the timing controller TC generates data control signals DCS for control of the data driver DD and gate control signals GCS for control of the gate driver GD using timing control signals (a horizontal synchronous signal Hsync, a vertical synchronous signal Vsync, a dot clock DCLK and a data enable signal DE) from the system.

The data driver DD converts image data Data into analog gamma-compensated voltages based on gamma reference voltages GMA from a gamma reference voltage generator (not shown) in response to the data control signals DCS from the timing controller TC and supplies the analog gamma-compensated voltages as image data voltages to the data lines DL1 to DLk of the liquid crystal panel 100. The data control signals DCS include a source shift clock (SSC), a source start pulse (SSP), a source output enable (SOE) signal, and a polarity control signal.

The gate driver GD generates scan pulses in response to the gate control signals GCS from the timing controller TC and sequentially supplies the generated scan pulses to the gate lines GL1 to GLj to select a horizontal line of the liquid crystal panel 100 to which image data Data are to be supplied. The gate control signals GCS include a gate start pulse, a gate shift clock, and a gate output enable signal.

Figure 2:
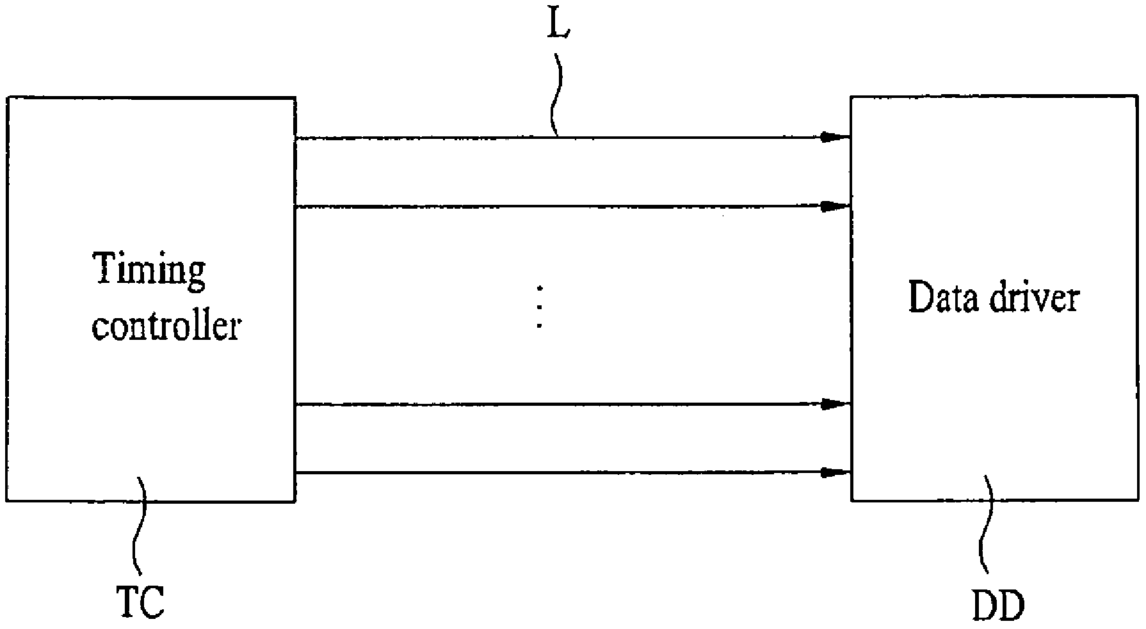
FIG. 2 shows an exemplary connection between a timing controller and a data driver from FIG. 1.

FIG. 2 shows an exemplary connection between a timing controller and a data driver from FIG. 1. As illustrated in FIG. 2, image data from the timing controller TC are supplied to the data driver DD through a plurality of data transmission lines L. At this time, all bits of one image data to be supplied to one pixel cell are transmitted at a time in parallel through the data transmission lines.

A data modulation circuit is provided in the timing controller TC to modulate image data to be outputted from the timing controller TC to minimize a transition between the image data, and a data restoration circuit is provided in the data driver DD to restore the modulated image data transmitted from the timing controller TC to the original image data.

Figure 3:
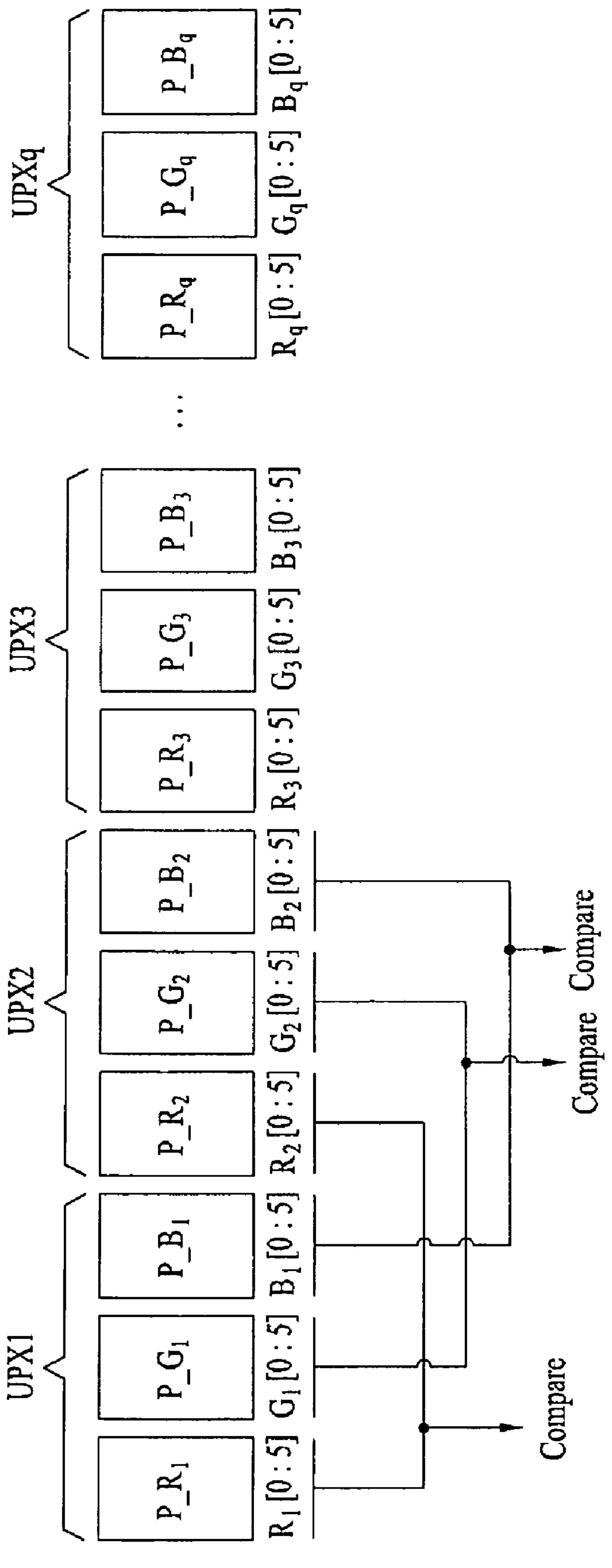
FIG. 3 shows exemplary comparison relations between pixel cells of one horizontal line connected in common to an arbitrary gate line in FIG. 1 according to an embodiment of the invention.

FIG. 3 shows exemplary comparison relations between pixel cells of one horizontal line connected in common to an arbitrary gate line in FIG. 1 according to an embodiment of the invention. As illustrated in FIG. 3, the pixel cells PXL of one horizontal line are arranged in the order of a red pixel cell P_Rq, a green pixel cell P_Gq and a blue pixel cell P_Bq. At this time, adjacent red pixel cell P_Rq, green pixel cell P_Gq and blue pixel cell P_Bq constitute a unit pixel UPXq displaying one image. A red image data voltage corresponding to red image data Rq[0:5] that is a digital signal is supplied to the red pixel cell P_Rq, a green image data voltage corresponding to green image data Gq[0:5] that is a digital signal is supplied to the green pixel cell P_Gq, and a blue image data voltage corresponding to blue image data Bq[0:5] that is a digital signal is supplied to the blue pixel cell P_Bq. Image data voltages are simultaneously supplied to the pixel cells PXL of one horizontal line, while image data which are source digital signals of the image data voltages are sequentially supplied to the timing controller TC. Also, image data from the timing controller TC are sequentially outputted and supplied to the data driver DD. For example, first red image data R1[0:5] corresponding to a first red pixel cell is firstly supplied to the timing controller TC and in turn to the data driver DD, and qth blue image data Bq[0:5] is lastly supplied to the timing controller TC and in turn to the data driver DD.

In an embodiment, in supplying image data (referred to hereinafter as 'specific image data') corresponding to any one pixel cell (referred to hereinafter as a 'specific pixel cell') located in an arbitrary unit pixel from the timing controller TC to the data driver DD, the specific image data is compared with arbitrary image data which is supplied to an arbitrary pixel cell, modulated based on the comparison result and then transmitted from the timing controller TC to the data driver DD. Here, the arbitrary pixel cell belongs to any unit pixel located adjacent to the arbitrary unit pixel to which the specific pixel cell belongs, and displays the same color as that of the specific pixel cell. In other words, image data corresponding to an nth pixel cell is compared with image data corresponding to an (n−3)th pixel cell and then modulated according to the comparison result.

For example, second red image data R2[0:5] corresponding to a second red pixel cell P_R2 in a second unit pixel UPX2 is compared with first red image data R1[0:5] corresponding to a first red pixel cell P_R1 in a first unit pixel UPX1 and then modulated according to the comparison result.

Figure 4:
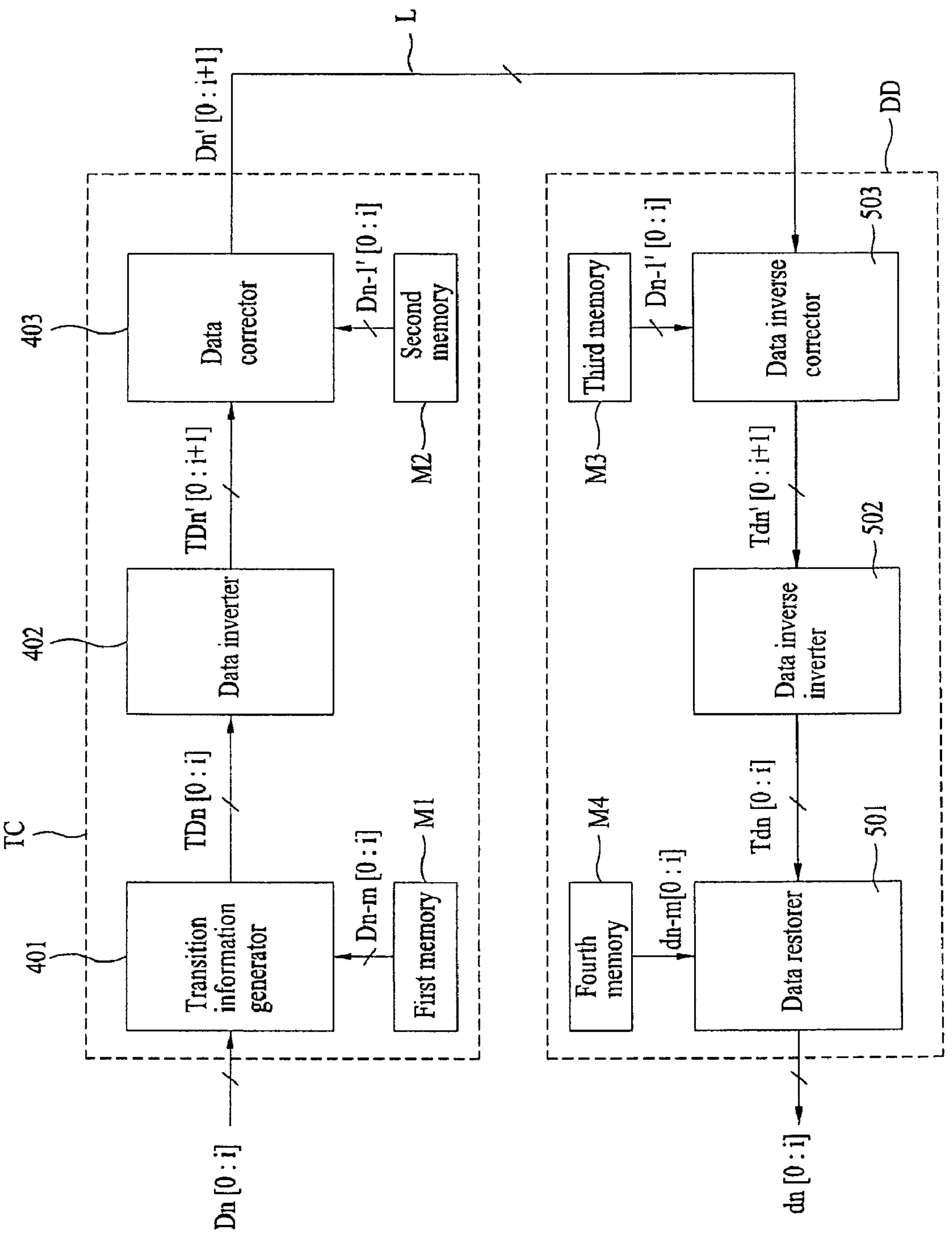
FIG. 4 is a block diagram showing exemplary configuration of a data modulation circuit of the timing controller and a data restoration circuit of the data driver according to an embodiment of the invention.

FIG. 4 is a block diagram showing exemplary configuration of a data modulation circuit of the timing controller TC and a data restoration circuit of the data driver DD according to an embodiment of the invention. The data modulation circuit of the timing controller TC includes, as shown in FIG. 4, a transition information generator 401, a data inverter 402, a data corrector 403, a first memory M1, and a second memory M2. The transition information generator 401 exclusive-NORs nth image data Dn[0:i] (where n is a natural number) inputted from the system and (n−m)th image data Dn−m[0:i] (where m is a natural number smaller than n) expressing the same color as that of the nth image data and generates transition information data TDn[0:i] as a result of the exclusive-NORing. Here, i is a natural number.

The data inverter 402, when the number of logic '1s' included in the transition information data TDn[0:i] from the transition information generator 401 is larger than that of logic '0s' included therein, inverts the logics of all bits included in the transition information data TDn[0:i] and adds a unit bit having a logic value '1' to the inverted transition information data as inversion data RV1[6] (shown in FIG. 5A, for example) indicative of inversion information. Conversely, when the number of logic '1s' included in the transition information data TDn[0:i] is equal to or smaller than that of logic '0s' included therein, the data inverter 402 adds a unit bit having a logic value '0' to the transition information data as the inversion data RV1[6] (shown in FIG. 5A, for example).

The data corrector 403 exclusive-NORs the resulting transition information data TDn'[0:i+1] from the data inverter 402 and corrected image data Dn−1'[0:i] of (n−1)th image data, generates corrected image data Dn'[0:i+1] of the nth image data as a result of the exclusive-NORing, and supplies the generated corrected image data Dn'[0:i+1] to the data restoration circuit of the data driver DD through the data transmission lines L.

The data restoration circuit of the data driver DD includes, as shown in FIG. 4, a data inverse corrector 503, a data inverse inverter 502, a data restorer 501, a third memory M3, and a fourth memory M4.

The data inverse corrector 503 exclusive-NORs the corrected image data Dn'[0:i+1] from the data corrector 403 and the corrected image data Dn−1'[0:i] of the (n−1)th image data and generates inverse transition information data Tdn'[0:i+1] as a result of the exclusive-NORing.

The data inverse inverter 502, when the inversion data RV1[6] of the inverse transition information data from the data inverse corrector 503 has the logic value '1', inverts the logics of all bits included in the inverse transition information data and removes the inversion data RV1[6] from the inverse transition information data. Conversely, when the inversion data RV1[6] has the logic value '0', the data inverse inverter 502 maintains the logics of all the bits of the inverse transition information data as they are and removes the inversion data RV1[6] from the inverse transition information data.

The data restorer 501 exclusive-NORs the resulting inverse transition information data Tdn[0:i] from the data inverse inverter 502 and the (n−m)th image data dn−m[0:i] and restores the original nth image data Dn[0:i] as a result of the exclusive-NORing.

FIGS. 5A to 5F are block diagrams illustrating the operation of a data transition minimization circuit according to an embodiment of the invention.

Initial red image data R0[0:5], initial green image data G0[0:5] and initial blue image data B0[0:5] each having the logic value '0' as an initial value are pre-stored in each of the first and fourth memories M1 and M4, and initial image data having the logic value '0' as an initial value is pre-stored in each of the second and third memories M2 and M3.

The timing controller TC receives image data from the system in the order of red image data, green image data and blue image data and outputs the received image data in order. Notably, the timing controller TC outputs each image data in the following manner.

A process of modulating and restoring first red image data R1[0:5] will hereinafter be described with reference to FIG. 5A.

The first red image data R1[0:5] firstly inputted to the timing controller TC is modulated through the transition information generator 401, data inverter 402 and data corrector 403 included in the timing controller TC and then outputted from the timing controller TC.

That is, the first red image data R1[0:5] is supplied to the transition information generator 401 in the timing controller TC. The transition information generator 401 exclusive-NORs the currently supplied first red image data R1[0:5] and image data supplied earlier than the first red image data R1[0:5] and having the same color information as that of the first red image data R1[0:5] and generates transition information data TR1[0:5] as a result of the exclusive-NORing.

On the other hand, because the first red image data R1[0:5] is, first of red image data, supplied to the timing controller TC, there is no red image data outputted earlier than the first red image data R1[0:5]. In this regard, in this initial period, the initial red image data R0[0:5] stored in the first memory M1 is the image data supplied earlier than the first red image data R1[0:5].

Accordingly, the transition information generator 401 exclusive-NORs the first red image data R1[0:5] and the initial red image data R0[0:5] and generates the transition information data TR1[0:5] as a result of the exclusive-NORing. In other words, the transition information generator 401 exclusive-NORs respective unit bits constituting the first red image data R1[0:5] and respective unit bits constituting the initial red image data R0[0:5] by corresponding digits. For example, in the case where the first red image data R1[0:5] is 6-bit digital data, '011000', and the initial red image data R0[0:5] is 6-bit digital data, '000000', the transition information data TR1[0:5] generated by the exclusive-NORing of those two data is 6-bit digital data, '011000'. This operation will hereinafter be described in more detail.

Figure 5A:
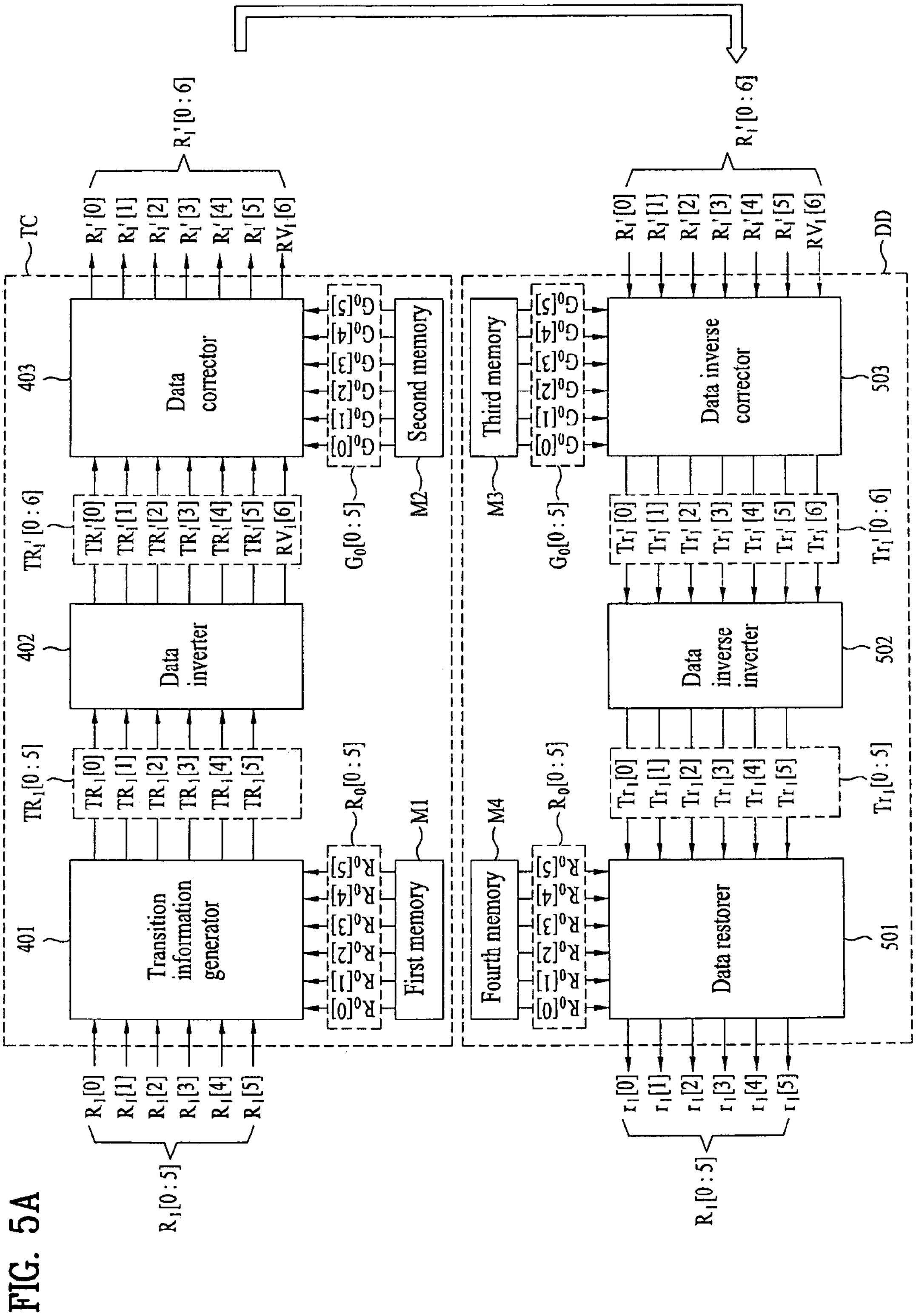
FIGS. 5A to 5F are block diagrams illustrating the operation of a data transition minimization circuit according to an embodiment of the invention.

The unit bits of the first red image data R1[0:5] are composed of R1[0], R1[i], R1[2], R1[3], R1[4] and R1[5] as shown in FIG. 5A, in which R1[0] signifies a most significant bit of the first red image data R1[0:5] and represents a unit bit having the logic value '0' located leftmost among '011000', R1[i] signifies a first weight bit of the first red image data R1[0:5] and represents a unit bit having the logic value '1' located in a first digit from the most significant bit among '011000', R1[2] signifies a second weight bit of the first red image data R1[0:5] and represents a unit bit having the logic value '1' located in a first digit from the most significant bit among '011000', R1[3] signifies a third weight bit of the first red image data R1[0:5] and represents a unit bit having the logic value '0' located in a third digit from the most significant bit among '011000', R1[4] signifies a fourth weight bit of the first red image data R1[0:5] and represents a unit bit having the logic value '0' located in a fourth digit from the most significant bit among '011000', and R1[5] signifies a least significant bit of the first red image data R1[0:5] and represents a unit bit having the logic value '0' located in a fifth digit from the most significant bit among '011000'.

Also, the unit bits of the initial red image data R0[0:5] are composed of R0[0], R0[1], R0[2], R0[3], R0[4] and R0[5] as shown in FIG. 5A, in which R0[0] signifies a most significant bit of the initial red image data R0[0:5] and represents a unit bit having the logic value '0' located leftmost among '000000', R0[1] signifies a first weight bit of the initial red image data R0[0:5] and represents a unit bit having the logic value '0' located in a first digit from the most significant bit among '000000', R0[2] signifies a second weight bit of the initial red image data R0[0:5] and represents a unit bit having the logic value '0' located in a second digit from the most significant bit among '000000', R0[3] signifies a third weight bit of the initial red image data R0[0:5] and represents a unit bit having the logic value '0' located in a third digit from the most significant bit among '000000', R0[4] signifies a fourth weight bit of the initial red image data R0[0:5] and represents a unit bit having the logic value '0' located in a fourth digit from the most significant bit among '000000', and R0[5] signifies a least significant bit of the initial red image data R0[0:5] and represents a unit bit having the logic value '0' located in a fifth digit from the most significant bit among '000000'.

To exclusive-NOR the first red image data R1[0:5] and initial red image data R0[0:5] with these configurations means to exclusive-NOR the unit bit R1[0] and the unit bit R0[0], exclusive-NOR the unit bit R1[1] and the unit bit R0[1], exclusive-NOR the unit bit R1[2] and the unit bit R0[2], exclusive-NOR the unit bit R1[3] and the unit bit R0[3], exclusive-NOR the unit bit R1[4] and the unit bit R0[4] and exclusive-NOR the unit bit R1[5] and the unit bit R0[5].

The transition information data TR1[0:5] indicates whether a transition has occurred between each unit bit of the first red image data R1[0:5] and each unit bit of the initial red image data R0[0:5] by corresponding digits. In other words, the logic value '0' in the transition information data TR1[0:5] signifies that two corresponding unit bits have the same logic value and no transition has thus occurred therebetween, and the logic value '1' in the transition information data TR1[0:5] signifies that two corresponding unit bits have different logic values and a transition has thus occurred therebetween. For example, a most significant bit (MSB) located in a highest-weight digit, among six unit bits constituting the transition information data TR1[0:5], represents the logic value '0', because both the MSB of the first red image data and the MSB of the initial red image data have the logic value '0'.

This transition information generator 401 supplies the transition information data TR1[0:5] to the data inverter 402 and also stores the first red image data R1[0:5] in the first memory M1 to update the initial red image data R0[0:5] previously stored in the first memory M1 with the first red image data R1[0:5]. As a result, the first red image data R1[0:5] is stored in the first memory M1 together with the initial green image data G0[0:5] and initial blue image data B0[0:5] after the transition information data TR1[0:5] is outputted from the transition information generator 401.

The data inverter 402 receives the transition information data TR1[0:5] from the transition information generator 401, checks the number of unit bits having the logic value '1' and the number of unit bits having the logic value '0', among the unit bits constituting the transition information data TR1[0:5], and, when it is determined based on the check result that the number of unit bits having the logic value '1' is larger than the number of unit bits having the logic value '0', inverts the logics of all the bits included in the transition information data TR1[0:5] and adds a unit bit of one bit having the logic value '1' to the inverted transition information data TR1[0:5] as the inversion data RV1[6] indicative of the inversion information. Conversely, when it is determined that the number of unit bits having the logic value '1' is equal to or smaller than the number of unit bits having the logic value '0', the data inverter 402 adds a unit bit of one bit having the logic value '0' to the transition information data TR1[0:5] as the inversion data RV1[6] under the condition of maintaining the transition information data TR1[0:5] as it is. For example, in the case where the transition information data TR1[0:5] is '011000' as stated above, the number of unit bits having the logic value '0' in the transition information data TR1[0:5] is four and the number of unit bits having the logic value '1' therein is two. As a result, because the number of unit bits having the logic value '0' is larger than the number of unit bits having the logic value '1', this transition information data TR1[0:5] is not inverted. Also, the inversion data RV1[6] having the logic value '0' is added to the transition information data TR1[0:5] as a flag bit indicating that this transition information data TR1[0:5] has not been inverted. At this time, the inversion data RV1[6] becomes a least significant bit (LSB) of the resulting transition information data TR1'[0:6]. Consequently, the transition information data TR1[0:5] is increased in bit size by the added inversion data RV1[6]. For example, in the case where the transition information data TR1[0:5] is 6-bit data, '011000', as stated above, it is converted into 7-bit data, '0110000'. In this 7-bit transition information data TR1'[0:6], the high-order 6 bits represent information about a transition between the first red image data R1[0:5] and the initial red image data R0[0:5], and the LSB represents inversion information.

The transition information data TR1'[0:6] with the inversion data RV1[6] added in this manner is supplied to the data corrector 403. This data corrector 403 exclusive-NORs corrected image data of image data outputted immediately before the first red image data R1[0:5] to be currently outputted and the transition information data TR1'[0:6] and generates corrected image data of the first red image data R1[0:5] as a result of the exclusive-NORing. On the other hand, because the first red image data R1[0:5] is, first of all, supplied to the timing controller TC, there is no image data outputted earlier than the first red image data R1[0:5].

As a result, in this initial period, the initial image data stored in the second memory M2 is the corrected image data of the previously outputted image data. Consequently, the data corrector 403 exclusive-NORs the transition information data TR1'[0:6] about the first red image data R1[0:5] and the initial image data in the second memory M2 and finally outputs the corrected image data of the first red image data R1[0:5] as a result of the exclusive-NORing. For example, because the transition information data TR1'[0:6] is '0110000' and the initial blue image data B0[0:5] is '000000', as stated previously, the corrected image data of the first red image data R1[0:5] is '0110000'. At this time, the inversion data RV1[6] '0' in the transition information data TR1'[0:6] is excluded from the operation and thus becomes an LSB of the corrected image data directly without being changed in logic value. Here, for the convenience of the subsequent description, the corrected image data of the first red image data R1[0:5] will hereinafter be renamed first red corrected image data R1'[0:6].

Also, the data corrector 403 outputs the first red corrected image data R1'[0:6] to the data driver DD and also stores it in the second memory M2 to update the initial image data previously stored in the second memory M2 with the first red corrected image data R1'[0:6]. As a result, the first red corrected image data R1'[0:6] is stored in the second memory M2 after being outputted from the data corrector 403. At this time, the first red corrected image data R1'[0:6] stored in the second memory M2 may not include the inversion data RV1[6] or may include the inversion data RV1[6]. In an embodiment, the first red corrected image data R1'[0:6] stored in the second memory M2 is regarded as 6-bit data that does not include the inversion data RV1[6].

In conclusion, the timing controller TC modulates the first red image data R1[0:5] firstly inputted thereto to generate the first red corrected image data R1'[0:6], and supplies the first red corrected image data R1'[0:6] to the data driver DD through the data transmission lines. At this time, the unit bits constituting the first red corrected image data R1'[0:6] are supplied to the data driver DD at a time through the same number of data transmission lines as that of the unit bits.

The data restoration circuit of the data driver DD inverse-transforms the first red corrected image data R1'[0:6] using the initial red image data R0[0:5] and the initial image data to restore the first red corrected image data R1'[0:6] to the original first red image data R1[0:5]. This restoration process will hereinafter be described in detail.

The data inverse corrector 503 exclusive-NORs the first red corrected image data R1'[0:6] currently supplied from the data corrector 403 and corrected image data supplied immediately before the first red corrected image data R1'[0:6] and generates inverse transition information data Tr1'[0:6] as a result of the exclusive-NORing. On the other hand, because the first red corrected image data R1'[0:6] is, first of all, supplied to the data inverse corrector 503, there is no image data outputted earlier than the first red corrected image data R1'[0:6].

As a result, in this initial period, the initial image data stored in the third memory M3 is the previously outputted corrected image data. Consequently, the data inverse corrector 503 exclusive-NORs the first red corrected image data R1'[0:6] and the initial image data in the third memory M3 and generates the inverse transition information data Tr1'[0:6] as a result of the exclusive-NORing. For example, because the first red corrected image data R1'[0:6] is '0110000' and the initial image data is '000000', as stated previously, the inverse transition information data Tr1'[0:6] is '0110000'. At this time, the inversion data RV1[6], which is the LSB of the first red corrected image data R1'[0:6], is excluded from the operation and thus becomes an LSB of the inverse transition information data Tr1'[0:6] directly without being changed in logic value.

This data inverse corrector 503 supplies the inverse transition information data Tr1'[0:6] to the data inverse inverter 502 and also stores the first red corrected image data R1'[0:6] in the third memory M3 to update the initial image data previously stored in the third memory M3 with the first red corrected image data R1'[0:6]. As a result, the first red corrected image data R1'[0:6] is stored in the third memory M3 after the inverse transition information data Tr1'[0:6] is outputted from the data inverse corrector 503. At this time, the first red corrected image data R1'[0:6] stored in the third memory M3 may not include the inversion data RV1[6] or may include the inversion data RV1[6]. In the present invention, the first red corrected image data R1'[0:6] stored in the third memory M3 is regarded as 6-bit data that does not include the inversion data RV1[6].

The data inverse inverter 502, when the inversion data RV1[6] of the inverse transition information data Tr1'[0:6]

from the data inverse corrector 503 has the logic value '1', inverts the logics of all bits of the inverse transition information data Tr1'[0:6] and removes the inversion data RV1[6] from the inverse transition information data Tr1'[0:6]. Conversely, when the inversion data RV1[6] has the logic value '0', the data inverse inverter 502 maintains the logics of all the bits of the inverse transition information data Tr1'[0:6] as they are and removes the inversion data RV1[6] from the inverse transition information data Tr1'[0:6]. For example, in the case where the inverse transition information data Tr1'[0:6] is '0110000' as stated above, the inversion data RV1[6], which is the LSB of the inverse transition information data Tr1'[0:6], represents the logic value '0'. As a result, the data inverse inverter 502 maintains the logics of all the bits of the inverse transition information data Tr1'[0:6] as they are and removes the LSB, or inversion data RV1[6], from the inverse transition information data Tr1'[0:6]. Consequently, the resulting inverse transition information data Tr1[0:5] outputted from the data inverse inverter 502 is 6-bit data, '011000'.

The inverse transition information data Tr1[0:5] from the data inverse inverter 502 is supplied to the data restorer 501. The data restorer 501 exclusive-NORs the currently supplied inverse transition information data Tr1[0:5] and image data supplied earlier than the above-stated first red image data R1[0:5] and having the same color information as that of the first red image data R1[0:5] and generates restored image data as a result of the exclusive-NORing. At this time, the image data supplied earlier than the first red image data R1[0:5] is red image data expressing the same color as that of the first red image data R1[0:5], which signifies the initial red image data R0[0:5] in the first memory M1 as stated previously.

The data restorer 501 exclusive-NORs the inverse transition information data Tr1[0:5] and the initial red image data R0[0:5] in the fourth memory M4 and generates the restored image data as a result of the exclusive-NORing. For example, because the inverse transition information data Tr1[0:5] from the data inverse inverter 502 is '011000' and the initial red image data R0[0:5] in the fourth memory M4 is '000000', as stated previously, the restored image data is '011000'. For the convenience of description, this restored image data will hereinafter be renamed first red restored image data r1[0:5]. This first red restored image data r1[0:5] from the data restorer 501 is the same as the first red image data R1[0:5] supplied to the transition information generator 401.

This data restorer 501 supplies the first red restored image data r1[0:5] to a drive integrated circuit and also stores it in the fourth memory M4 to update the initial red image data R0[0:5] previously stored in the fourth memory M4 with the first red restored image data r1[0:5]. As a result, the first red restored image data r1[0:5] is stored in the fourth memory M4 together with the initial green image data G0[0:5] and initial blue image data B0[0:5] after being outputted from the data restorer 501.

Thereafter, first green image data G1[0:5] is secondly supplied to the timing controller TC subsequently to the first red image data R1[0:5]. The timing controller TC modulates the first green image data G1[0:5] in a similar manner to the above-stated first red image data R1[0:5].

Figure 5B:
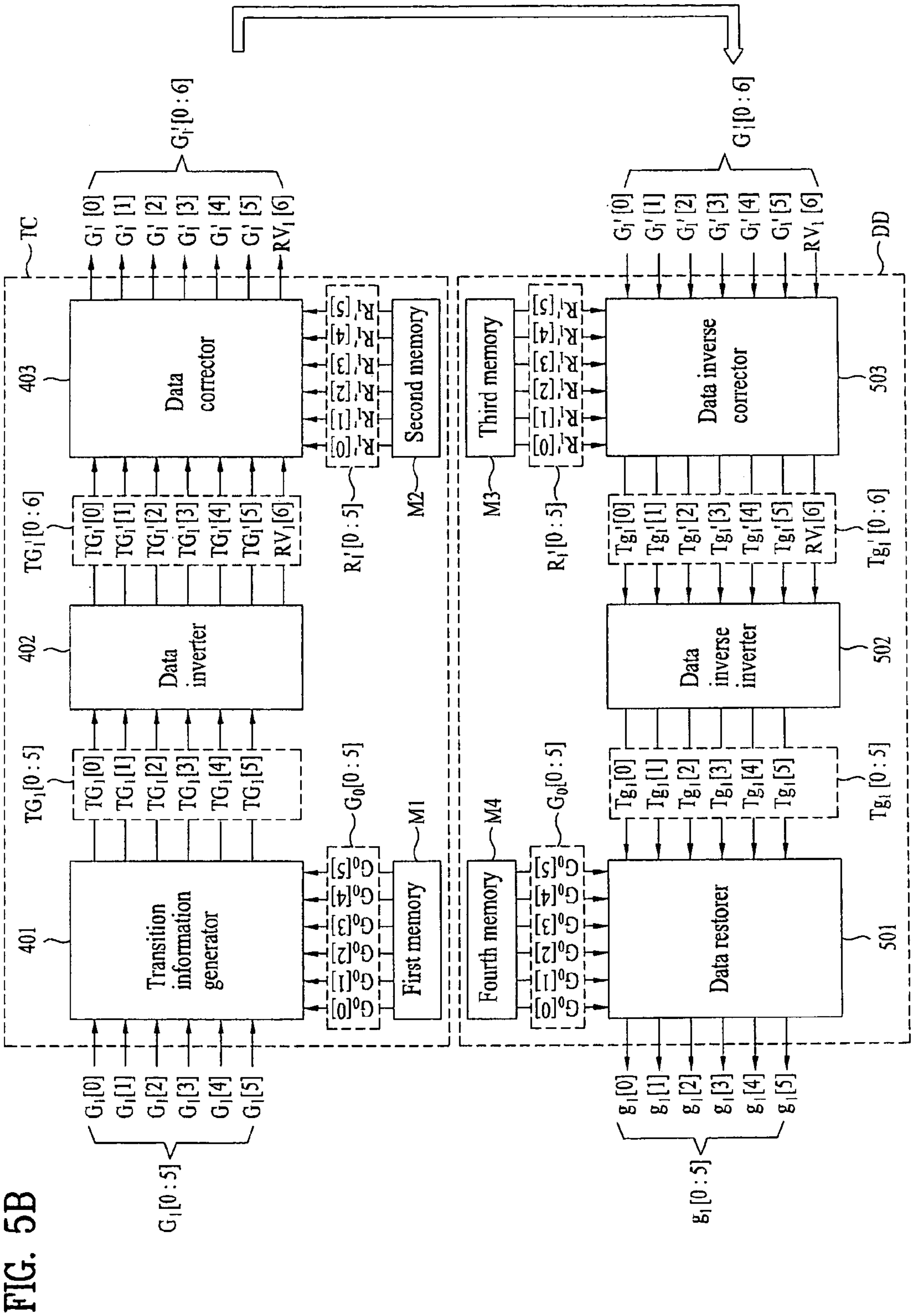

A process of modulating and restoring the first green image data G1[0:5] will hereinafter be described with reference to FIG. 5B.

The first green image data G1[0:5] secondly inputted to the timing controller TC is modulated through the transition information generator 401, data inverter 402 and data corrector 403 included in the timing controller TC and then outputted from the timing controller TC.

That is, the first green image data G1[0:5] is supplied to the transition information generator 401 in the timing controller TC. The transition information generator 401 exclusive-NORs the currently supplied first green image data G1[0:5] and image data supplied earlier than the first green image data G1[0:5] and having the same color information as that of the first green image data G1[0:5] and generates transition information data TG1[0:5] as a result of the exclusive-NORing.

On the other hand, because the first green image data G1[0:5] is, first of green image data, supplied to the timing controller TC, there is no green image data outputted earlier than the first green image data G6[0:5]. In this regard, in this initial period, the initial green image data G0[0:5] stored in the first memory M1 is the image data supplied earlier than the first green image data G1[0:5].

Accordingly, the transition information generator 401 exclusive-NORs the first green image data G1[0:5] and the initial green image data G0[0:5] and generates the transition information data TG1[0:5] as a result of the exclusive-NORing.

For example, in the case where the first green image data G1[0:5] is 6-bit digital data, '111100', and the initial green image data G0[0:5] is 6-bit digital data, '000000', the transition information data TG1[0:5] generated by the exclusive-NORing of those two data is 6-bit digital data, '111100'.

This transition information generator 401 supplies the transition information data TG1[0:5] to the data inverter 402 and also stores the first green image data G1[0:5] in the first memory M1 to update the initial green image data G0[0:5] previously stored in the first memory M1 with the first green image data G1[0:5]. As a result, the first green image data G6[0:5] is stored in the first memory M1 together with the first red image data R1[0:5] and initial blue image data B0[0:5] after the transition information data TG1[0:5] is outputted from the transition information generator 401.

The data inverter 402 receives the transition information data TG1[0:5] from the transition information generator 401, checks the number of unit bits having the logic value '1' and the number of unit bits having the logic value '0', among the unit bits constituting the transition information data TG1[0:5], and, when it is determined based on the check result that the number of unit bits having the logic value '1' is larger than the number of unit bits having the logic value '0', inverts the logics of all the bits included in the transition information data TG1[0:5] and adds a unit bit of one bit having the logic value '1' to the inverted transition information data TG1[0:5] as the inversion data RV1[6] indicative of the inversion information. Conversely, when it is determined that the number of unit bits having the logic value '1' is equal to or smaller than the number of unit bits having the logic value '0', the data inverter 402 adds a unit bit of one bit having the logic value '0' to the transition information data TG1[0:5] as the inversion data RV1[6] under the condition of maintaining the transition information data TG1[0:5] as it is. For example, in the case where the transition information data TG1[0:5] is '111100' as stated above, the number of unit bits having the logic value '1' in the transition information data TG1[0:5] is four and the number of unit bits having the logic value '0' therein is two. As a result, because the number of unit bits having the logic value '1' is larger than the number of unit bits having the logic value '0', this transition information data TG1[0:5] is inverted. Also, the inversion data RV1[6] having the logic value '1' is added to the transition information data TG1[0:5] as a flag bit indicating that this transition information data TG1[0:5] has been inverted. At this time, the inversion data RV1[6] becomes a least significant bit (LSB) of the resulting transition information data TG1'[0:6]. Consequently, the transition information data TG1[0:5] is increased in bit size by the added inversion data RV1[6]. For example, in the case where the transition information data TG1[0:5] is 6-bit data, '111100', as stated above, it is converted into 7-bit data, '0000111'. In this 7-bit transition information data TG1'[0:6], the high-order 6 bits represent information about a transition between the first green image data G1[0:5] and the initial green image data G0[0:5], and the LSB represents inversion information.

The transition information data TG1'[0:6] with the inversion data RV1[6] added in this manner is supplied to the data corrector 403. This data corrector 403 exclusive-NORs corrected image data of image data outputted immediately before the first green image data G1[0:5] to be currently outputted and the transition information data TG1'[0:6] and generates corrected image data of the first green image data G1[0:5] as a result of the exclusive-NORing. That is, the data corrector 403 exclusive-NORs the transition information data TG1'[0:6] about the first green image data G1[0:5] and the first red corrected image data R1'[0:6] in the second memory M2 and generates first green corrected image data G1'[0:6] as a result of the exclusive-NORing. For example, because the transition information data TG1'[0:6] is '0000111' and the first red corrected image data R1'[0:6] is '011000', as stated previously, the first green corrected image data G1'[0:6] is '0110111'. At this time, the inversion data RV1[6] '1' in the transition information data TG1'[0:6] is excluded from the operation and thus becomes an LSB of the first green corrected image data G1'[0:6] directly without being changed in logic value.

Also, the data corrector 403 outputs the first green corrected image data G1'[0:6] to the data driver DD and also stores it in the second memory M2 to update the first red corrected image data R1'[0:6] previously stored in the second memory M2 with the first green corrected image data G1'[0:6]. As a result, the first green corrected image data G1'[0:6] is stored in the second memory M2 after being outputted from the data corrector 403.

In conclusion, the timing controller TC modulates the first green image data G1[0:5] secondly inputted thereto to generate the first green corrected image data G1'[0:6], and supplies the first green corrected image data G1'[0:6] to the data driver DD through the data transmission lines. At this time, the unit bits constituting the first green corrected image data G1'[0:6] are supplied to the data driver DD at a time through the same number of data transmission lines as that of the unit bits.

The data restoration circuit of the data driver DD inverse-transforms the first green corrected image data G1'[0:6] using the initial green image data G0[0:5] and the first red corrected image data R1'[0:6] to restore the first green corrected image data G1'[0:6] to the original first green image data G1[0:5]. This restoration process will hereinafter be described in detail.

The data inverse corrector 503 exclusive-NORs the first green corrected image data G1'[0:6] currently supplied from the data corrector 403 and corrected image data supplied immediately before the first green corrected image data G1'[0:6] and generates inverse transition information data Tg1'[0:6] as a result of the exclusive-NORing. That is, the data inverse corrector 503 exclusive-NORs the first green corrected image data G1'[0:6] and the first red corrected image data R1'[0:6] in the third memory M3 and generates the inverse transition information data Tg1'[0:6] as a result of the exclusive-NORing. For example, because the first green corrected image data G1'[0:6] is '0110111' and the first red corrected image data R1'[0:6] is '011000', as stated previously, the inverse transition information data Tg1'[0:6] is '0000111'. At this time, the inversion data RV1[6], which is the LSB of the first green corrected image data G1'[0:6], is excluded from the operation and thus becomes an LSB of the inverse transition information data Tg1'[0:6] directly without being changed in logic value.

This data inverse corrector 503 supplies the inverse transition information data Tg1'[0:6] to the data inverse inverter 502 and also stores the first green corrected image data G1'[0:6] in the third memory M3 to update the first red corrected image data R1'[0:6] previously stored in the third memory M3 with the first green corrected image data G1'[0:6]. As a result, the first green corrected image data G1'[0:6] is stored in the third memory M3 after the inverse transition information data Tg1'[0:6] is outputted from the data inverse corrector 503.

The data inverse inverter 502, when the inversion data RV1[6] of the inverse transition information data Tg1'[0:6] from the data inverse corrector 503 has the logic value '1', inverts the logics of all bits of the inverse transition information data Tg1'[0:6] and removes the inversion data RV1[6] from the inverse transition information data Tg1'[0:6]. Conversely, when the inversion data RV1[6] has the logic value '0', the data inverse inverter 502 maintains the logics of all the bits of the inverse transition information data Tg1'[0:6] as they are and removes the inversion data RV1[6] from the inverse transition information data Tg1'[0:6]. For example, in the case where the inverse transition information data Tg1'[0:6] is '0000111' as stated above, the inversion data RV1[6], which is the LSB of the inverse transition information data Tg1'[0:6], represents the logic value '1'. As a result, the data inverse inverter 502 inverts the logics of all the bits of the inverse transition information data Tg1'[0:6] and removes the LSB, or inversion data RV1[6], from the inverse transition information data Tg1'[0:6]. Consequently, the resulting inverse transition information data Tg1[0:5] outputted from the data inverse inverter 502 is 6-bit data, '111100'.

The inverse transition information data Tg1[0:5] from the data inverse inverter 502 is supplied to the data restorer 501. The data restorer 501 exclusive-NORs the currently supplied inverse transition information data Tg1[0:5] and image data supplied earlier than the above-stated first green image data G1[0:5] and having the same color information as that of the first green image data G1[0:5] and generates restored image data as a result of the exclusive-NORing. At this time, the image data supplied earlier than the first green image data G1[0:5] is green image data expressing the same color as that of the first green image data G1[0:5], which signifies the initial green image data G0[0:5] in the first memory M1 as stated previously.

The data restorer 501 exclusive-NORs the inverse transition information data Tg1[0:5] and the initial green image data G0[0:5] in the fourth memory M4 and generates first green restored image data g1[0:5] as a result of the exclusive-NORing. For example, because the inverse transition information data Tg1[0:5] from the data inverse inverter 502 is '111100' and the initial green image data G0[0:5] in the fourth memory M4 is '000000', as stated previously, the first green restored image data g1[0:5] is '111100'. This first green restored image data g1[0:5] from the data restorer 501 is the same as the first green image data G1[0:5] supplied to the transition information generator 401.

This data restorer 501 supplies the first green restored image data g1[0:5] to the drive integrated circuit and also stores it in the fourth memory M4 to update the initial green image data G0[0:5] previously stored in the fourth memory M4 with the first green restored image data g1[0:5]. As a result, the first green restored image data g1[0:5] is stored in the fourth memory M4 together with the first red restored image data r1[0:5] and initial blue image data B0[0:5] after being outputted from the data restorer 501.

Thereafter, first blue image data B1[0:5] is thirdly supplied to the timing controller TC subsequently to the first green image data G1[0:5]. The timing controller TC modulates the first blue image data B1[0:5] in a similar manner to the above-stated first green image data G1[0:5].

Figure 5C:
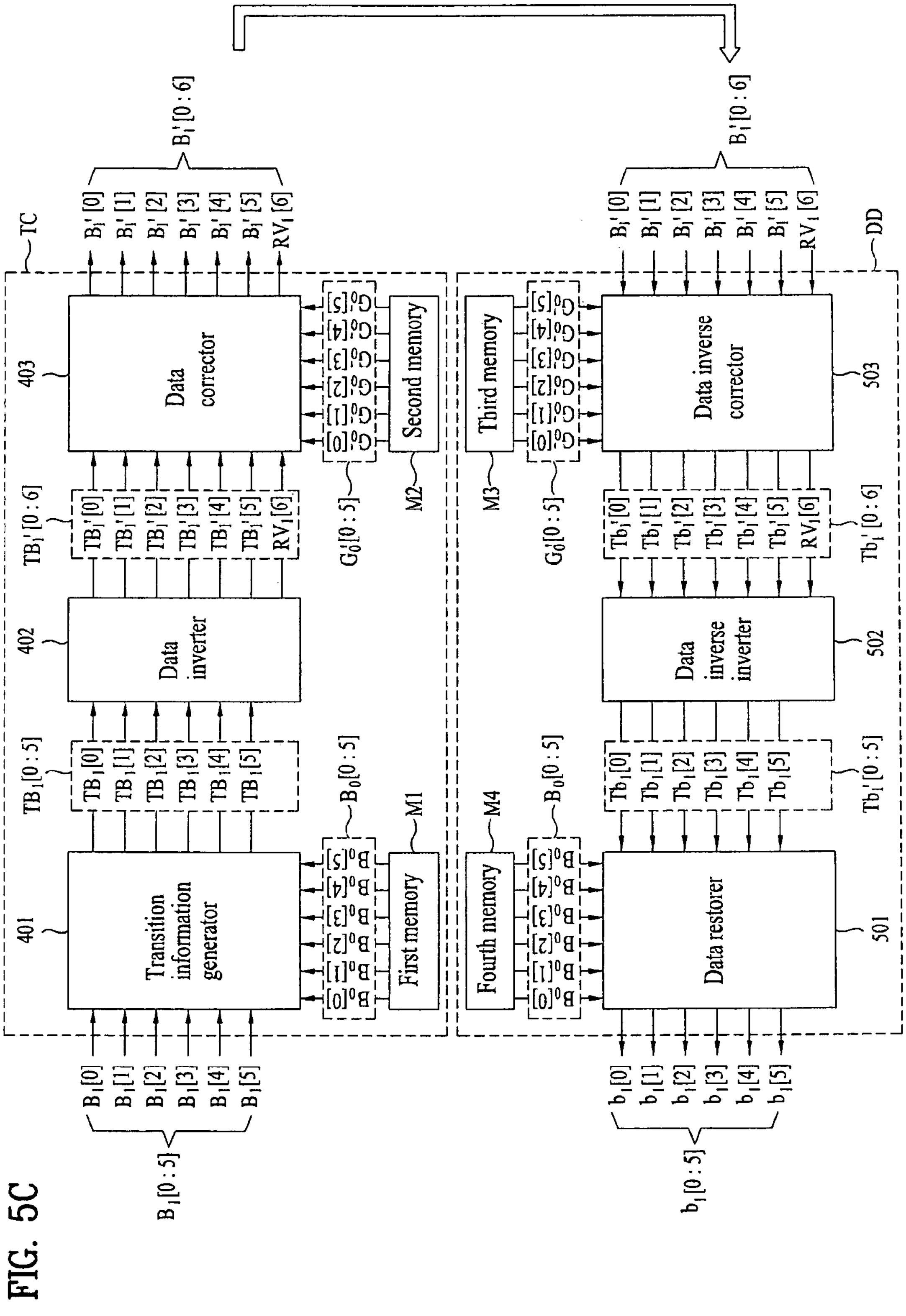

A process of modulating and restoring the first blue image data B1[0:5] will hereinafter be described with reference to FIG. 5C.

The first blue image data B1[0:5] thirdly inputted to the timing controller TC is modulated through the transition information generator 401, data inverter 402 and data corrector 403 included in the timing controller TC and then outputted from the timing controller TC.

That is, the first blue image data B1[0:5] is supplied to the transition information generator 401 in the timing controller TC. The transition information generator 401 exclusive-NORs the currently supplied first blue image data B1[0:5] and image data supplied earlier than the first blue image data B1[0:5] and having the same color information as that of the first blue image data B1[0:5] and generates transition information data TB1[0:5] as a result of the exclusive-NORing.

On the other hand, because the first blue image data B1[0:5] is, first of blue image data, supplied to the timing controller TC, there is no blue image data outputted earlier than the first blue image data B1[0:5]. In this regard, in this initial period, the initial blue image data B0[0:5] stored in the first memory M1 is the image data supplied earlier than the first blue image data B1[0:5].

Accordingly, the transition information generator 401 exclusive-NORs the first blue image data B1[0:5] and the initial blue image data B0[0:5] and generates the transition information data TB1[0:5] as a result of the exclusive-NORing.

For example, in the case where the first blue image data B1[0:5] is 6-bit digital data, '011100', and the initial blue image data B0[0:5] is 6-bit digital data, '000000', the transition information data TB1[0:5] generated by the exclusive-NORing of those two data is 6-bit digital data, '011100'.

This transition information generator 401 supplies the transition information data TB1[0:5] to the data inverter 402 and also stores the first blue image data B1[0:5] in the first memory M1 to update the initial blue image data B0[0:5] previously stored in the first memory M1 with the first blue image data B1[0:5]. As a result, the first blue image data B1[0:5] is stored in the first memory M1 together with the first red image data R1[0:5] and first green image data G1[0:5] after the transition information data TB1[0:5] is outputted from the transition information generator 401.

The data inverter 402 receives the transition information data TB1[0:5] from the transition information generator 401, checks the number of unit bits having the logic value '1' and the number of unit bits having the logic value '0', among the unit bits constituting the transition information data TB1[0:5], and, when it is determined based on the check result that the number of unit bits having the logic value '1' is larger than the number of unit bits having the logic value '0', inverts the logics of all the bits included in the transition information data TB1[0:5] and adds a unit bit of one bit having the logic value '1' to the inverted transition information data TB1[0:5] as the inversion data RV1[6] indicative of the inversion information. Conversely, when it is determined that the number of unit bits having the logic value '1' is equal to or smaller than the number of unit bits having the logic value '0', the data inverter 402 adds a unit bit of one bit having the logic value '0' to the transition information data TB1[0:5] as the inversion data RV1[6] under the condition of maintaining the transition information data TB1[0:5] as it is. For example, in the case where the transition information data TB1[0:5] is '011100' as stated above, the number of unit bits having the logic value '1' in the transition information data TB1[0:5] is three and the number of unit bits having the logic value '0' therein is three. As a result, because the number of unit bits having the logic value '1' is equal to the number of unit bits having the logic value '0', this transition information data TB1[0:5] is not inverted. Also, the inversion data RV1[6] having the logic value '0' is added to the transition information data TB1[0:5] as a flag bit indicating that this transition information data TB1[0:5] has not been inverted. At this time, the inversion data RV1[6] becomes a least significant bit (LSB) of the resulting transition information data TB1'[0:6]. Consequently, the transition information data TB1[0:5] is increased in bit size by the added inversion data RV1[6]. For example, in the case where the transition information data TB1[0:5] is 6-bit data, '011100', as stated above, it is converted into 7-bit data, '0111000'. In this 7-bit transition information data TB1'[0:6], the high-order 6 bits represent information about a transition between the first blue image data B1[0:5] and the initial blue image data B0[0:5], and the LSB represents inversion information.

The transition information data TB1'[0:6] with the inversion data RV1[6] added in this manner is supplied to the data corrector 403. This data corrector 403 exclusive-NORs corrected image data of image data outputted immediately before the first blue image data B1[0:5] to be currently outputted and the transition information data TB1'[0:6] and generates corrected image data of the first blue image data B1[0:5] as a result of the exclusive-NORing. That is, the data corrector 403 exclusive-NORs the transition information data TB1'[0:6] about the first blue image data B1[0:5] and the first green corrected image data G1'[0:6] in the second memory M2 and generates first blue corrected image data B1'[0:6] as a result of the exclusive-NORing. For example, because the transition information data TB1'[0:6] is '0111000' and the first green corrected image data G1'[0:6] is '011011', as stated previously, the first blue corrected image data B1'[0:6] is '0001110'. At this time, the inversion data RV1[6] '0' in the transition information data TB1'[0:6] is excluded from the operation and thus becomes an LSB of the first blue corrected image data B1'[0:6] directly without being changed in logic value.

Also, the data corrector 403 outputs the first blue corrected image data B1'[0:6] to the data driver DD and also stores it in the second memory M2 to update the first green corrected image data G1'[0:6] previously stored in the second memory M2 with the first blue corrected image data B1'[0:6]. As a result, the first blue corrected image data B1'[0:6] is stored in the second memory M2 after being outputted from the data corrector 403.

In conclusion, the timing controller TC modulates the first blue image data B1[0:5] thirdly inputted thereto to generate the first blue corrected image data B1'[0:6], and supplies the first blue corrected image data B1'[0:6] to the data driver DD through the data transmission lines. At this time, the unit bits constituting the first blue corrected image data B1'[0:6] are supplied to the data driver DD at a time through the same number of data transmission lines as that of the unit bits.

The data restoration circuit of the data driver DD inverse-transforms the first blue corrected image data B1'[0:6] using the initial blue image data B0[0:5] and the first green corrected image data G1'[0:6] to restore the first blue corrected image data B1'[0:6] to the original first blue image data B1[0:5]. This restoration process will hereinafter be described in detail.

The data inverse corrector 503 exclusive-NORs the first blue corrected image data B1'[0:6] currently supplied from the data corrector 403 and corrected image data supplied immediately before the first blue corrected image data B1'[0:6] and generates inverse transition information data Tb1'[0:6] as a result of the exclusive-NORing. That is, the data inverse corrector 503 exclusive-NORs the first blue corrected image data B1'[0:6] and the first green corrected image data G1'[0:6] in the third memory M3 and generates the inverse transition information data Tb1'[0:6] as a result of the exclusive-NORing. For example, because the first blue corrected image data B1'[0:6] is '0001110' and the first green corrected image data G1'[0:6] is '011011', as stated previously, the inverse transition information data Tb1'[0:6] is '0111000'. At this time, the inversion data RV1[6], which is the LSB of the first blue corrected image data B1'[0:6], is excluded from the operation and thus becomes an LSB of the inverse transition information data Tb1'[0:6] directly without being changed in logic value.

This data inverse corrector 503 supplies the inverse transition information data Tb1'[0:6] to the data inverse inverter 502 and also stores the first blue corrected image data B1'[0:6] in the third memory M3 to update the first green corrected image data G1'[0:6] previously stored in the third memory M3 with the first blue corrected image data B1'[0:6]. As a result, the first blue corrected image data B1'[0:6] is stored in the third memory M3 after the inverse transition information data Tb1'[0:6] is outputted from the data inverse corrector 503.

The data inverse inverter 502, when the inversion data RV1[6] of the inverse transition information data Tb1'[0:6] from the data inverse corrector 503 has the logic value '1', inverts the logics of all bits of the inverse transition information data Tb1'[0:6] and removes the inversion data RV1[6] from the inverse transition information data Tb1'[0:6]. Conversely, when the inversion data RV1[6] has the logic value '0', the data inverse inverter 502 maintains the logics of all the bits of the inverse transition information data Tb1'[0:6] as they are and removes the inversion data RV1[6] from the inverse transition information data Tb1'[0:6]. For example, in the case where the inverse transition information data Tb1'[0:6] is '0111000' as stated above, the inversion data RV1[6], which is the LSB of the inverse transition information data Tb1'[0:6], represents the logic value '0'. As a result, the data inverse inverter 502 maintains the logics of all the bits of the inverse transition information data Tb1'[0:6] as they are and removes the LSB, or inversion data RV1[6], from the inverse transition information data Tb1'[0:6]. Consequently, the resulting inverse transition information data Tb1[0:5] outputted from the data inverse inverter 502 is 6-bit data, '011100'.

The inverse transition information data Tb1[0:5] from the data inverse inverter 502 is supplied to the data restorer 501. The data restorer 501 exclusive-NORs the currently supplied inverse transition information data Tb1[0:5] and image data supplied earlier than the above-stated first blue image data B1[0:5] and having the same color information as that of the first blue image data B1 [0:5] and generates restored image data as a result of the exclusive-NORing. At this time, the image data supplied earlier than the first blue image data B1[0:5] is blue image data expressing the same color as that of the first blue image data B1[0:5], which signifies the initial blue image data B0[0:5] in the first memory M1 as stated previously.

The data restorer 501 exclusive-NORs the inverse transition information data Tb1[0:5] and the initial blue image data B0[0:5] in the fourth memory M4 and generates first blue restored image data b1[0:5] as a result of the exclusive-NORing. For example, because the inverse transition information data Tb1[0:5] from the data inverse inverter 502 is '011100' and the initial blue image data B0[0:5] in the fourth memory M4 is '000000', as stated previously, the first blue restored image data b1[0:5] is '011100'. This first blue restored image data b1[0:5] from the data restorer 501 is the same as the first blue image data B1[0:5] supplied to the transition information generator 401.

This data restorer 501 supplies the first blue restored image data b1[0:5] to the drive integrated circuit and also stores it in the fourth memory M4 to update the initial blue image data B0[0:5] previously stored in the fourth memory M4 with the first blue restored image data b1[0:5]. As a result, the first blue restored image data b1[0:5] is stored in the fourth memory M4 together with the first red restored image data r1[0:5] and first green restored image data g1[0:5] after being outputted from the data restorer 501.

Thereafter, second red image data R2[0:5] is fourthly supplied to the timing controller TC subsequently to the first blue image data B1[0:5]. The timing controller TC modulates the second red image data R2[0:5] in a similar manner to the above-stated first red image data R1[0:5].

Figure 5D:
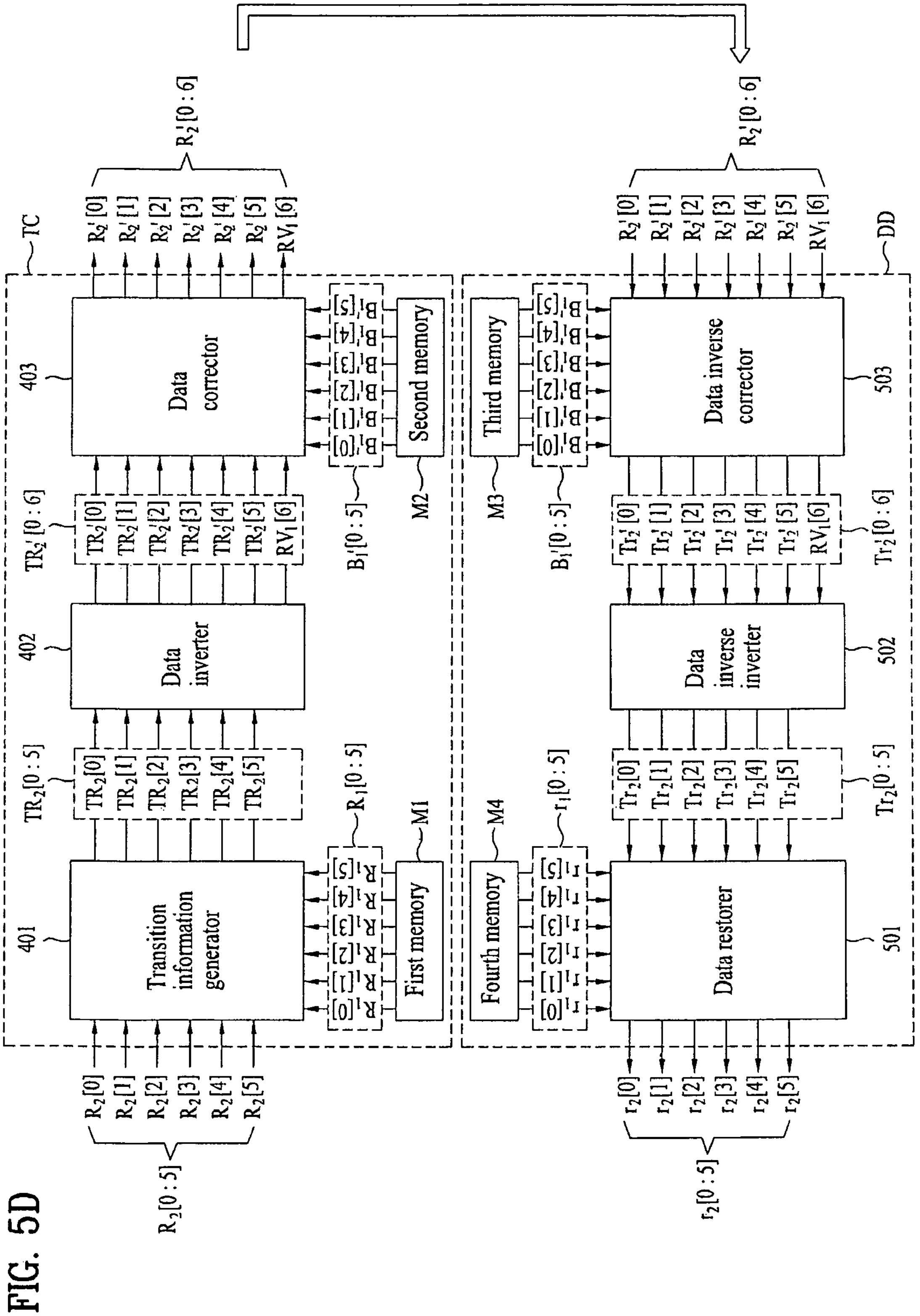

A process of modulating and restoring the second red image data R2[0:5] will hereinafter be described with reference to FIG. 5D.

The second red image data R2[0:5] fourthly inputted to the timing controller TC is modulated through the transition information generator 401, data inverter 402 and data corrector 403 included in the timing controller TC and then outputted from the timing controller TC.

That is, the second red image data R2[0:5] is supplied to the transition information generator 401 in the timing controller TC. The transition information generator 401 exclusive-NORs the currently supplied second red image data R2[0:5] and image data supplied earlier than the second red image data R2[0:5] and having the same color information as that of the second red image data R2[0:5] and generates transition information data TR2[0:5] as a result of the exclusive-NORing.

Accordingly, the transition information generator 401 exclusive-NORs the second red image data R2[0:5] and the first red image data R1[0:5] in the first memory M1 and generates the transition information data TR2[0:5] as a result of the exclusive-NORing.

For example, in the case where the second red image data R2[0:5] is 6-bit digital data, '011001', and the first red image data R1[0:5] is 6-bit digital data, '011000', the transition information data TR2[0:5] generated by the exclusive-NORing of those two data is 6-bit digital data, '000001'.

This transition information generator 401 supplies the transition information data TR2[0:5] to the data inverter 402 and also stores the second red image data R2[0:5] in the first memory M1 to update the first red image data R1[0:5] previously stored in the first memory M1 with the second red image data R2[0:5]. As a result, the second red image data R2[0:5] is stored in the first memory M1 together with the first green image data G1[0:5] and first blue image data B1[0:5] after the transition information data TR2[0:5] is outputted from the transition information generator 401.

The data inverter 402 receives the transition information data TR2[0:5] from the transition information generator 401, checks the number of unit bits having the logic value '1' and the number of unit bits having the logic value '0', among the unit bits constituting the transition information data TR2[0:5], and, when it is determined based on the check result that the number of unit bits having the logic value '1' is larger than the number of unit bits having the logic value '0', inverts the logics of all the bits included in the transition information data TR2[0:5] and adds a unit bit of one bit having the logic value '1' to the inverted transition information data TR2[0:5] as the inversion data RV1[6] indicative of the inversion information. Conversely, when it is determined that the number of unit bits having the logic value '1' is equal to or smaller than the number of unit bits having the logic value '0', the data inverter 402 adds a unit bit of one bit having the logic value '0' to the transition information data TR2[0:5] as the inversion data RV1[6] under the condition of maintaining the transition information data TR2[0:5] as it is. For example, in the case where the transition information data TR2[0:5] is '000001' as stated above, the number of unit bits having the logic value '1' in the transition information data TR2[0:5] is one and the number of unit bits having the logic value '0' therein is five. As a result, because the number of unit bits having the logic value '1' is smaller than the number of unit bits having the logic value '0', this transition information data TR2[0:5] is not inverted. Also, the inversion data RV1[6] having the logic value '0' is added to the transition information data TR2[0:5] as a flag bit indicating that this transition information data TR2[0:5] has not been inverted. At this time, the inversion data RV1[6] becomes a least significant bit (LSB) of the resulting transition information data TR2'[0:6]. Consequently, the transition information data TR2[0:5] is increased in bit size by the added inversion data RV1[6]. For example, in the case where the transition information data TR2[0:5] is 6-bit data, '000001', as stated above, it is converted into 7-bit data, '0000010'. In this 7-bit transition information data TR2'[0:6], the high-order 6 bits represent information about a transition between the second red image data R2[0:5] and the first red image data R1[0:5], and the LSB represents inversion information.

The transition information data TR2'[0:6] with the inversion data RV1[6] added in this manner is supplied to the data corrector 403. This data corrector 403 exclusive-NORs corrected image data of image data outputted immediately before the second red image data R2[0:5] to be currently outputted and the transition information data TR2'[0:6] and generates corrected image data of the second red image data R2[0:5] as a result of the exclusive-NORing. That is, the data corrector 403 exclusive-NORs the transition information data TR2'[0:6] about the second red image data R2[0:5] and the first blue corrected image data B1'[0:6] in the second memory M2 and generates second red corrected image data R2'[0:6] as a result of the exclusive-NORing. For example, because the transition information data TR2'[0:6] is '0000010' and the first blue corrected image data B1'[0:6] is '000111', as stated previously, the second red corrected image data R2'[0:6] is '0001100'. At this time, the inversion data RV1[6] '0' in the transition information data TR2'[0:6] is excluded from the operation and thus becomes an LSB of the second red corrected image data R2'[0:6] directly without being changed in logic value.

Also, the data corrector 403 outputs the second red corrected image data R2'[0:6] to the data driver DD and also stores it in the second memory M2 to update the first blue corrected image data B1'[0:6] previously stored in the second memory M2 with the second red corrected image data R2'[0:6]. As a result, the second red corrected image data R2'[0:6] is stored in the second memory M2 after being outputted from the data corrector 403.

In conclusion, the timing controller TC modulates the second red image data R2[0:5] fourthly inputted thereto to generate the second red corrected image data R2'[0:6], and supplies the second red corrected image data R2'[0:6] to the data driver DD through the data transmission lines. At this time, the unit bits constituting the second red corrected image data R2'[0:6] are supplied to the data driver DD at a time through the same number of data transmission lines as that of the unit bits.

The data restoration circuit of the data driver DD inverse-transforms the second red corrected image data R2'[0:6] using the first red image data R1[0:5] and the first blue corrected image data B1'[0:6] to restore the second red corrected image data R2'[0:6] to the original second red image data R2[0:5]. This restoration process will hereinafter be described in detail.

The data inverse corrector 503 exclusive-NORs the second red corrected image data R2'[0:6] currently supplied from the data corrector 403 and corrected image data supplied immediately before the second red corrected image data R2'[0:6] and generates inverse transition information data Tr2'[0:6] as a result of the exclusive-NORing. That is, the data inverse corrector 503 exclusive-NORs the second red corrected image data R2'[0:6] and the first blue corrected image data B1'[0:6] in the third memory M3 and generates the inverse transition information data Tr2'[0:6] as a result of the exclusive-NORing. For example, because the second red corrected image data R2'[0:6] is '0001100' and the first blue corrected image data B1'[0:6] is '000111', as stated previously, the inverse transition information data Tr2'[0:6] is '0000010'. At this time, the inversion data RV1[6], which is the LSB of the second red corrected image data R2'[0:6], is excluded from the operation and thus becomes an LSB of the inverse transition information data Tr2'[0:6] directly without being changed in logic value.

This data inverse corrector 503 supplies the inverse transition information data Tr2'[0:6] to the data inverse inverter 502 and also stores the second red corrected image data R2'[0:6] in the third memory M3 to update the first blue corrected image data B1'[0:6] previously stored in the third memory M3 with the second red corrected image data R2'[0:6]. As a result, the second red corrected image data R2'[0:6] is stored in the third memory M3 after the inverse transition information data Tr2'[0:6] is outputted from the data inverse corrector 503.

The data inverse inverter 502, when the inversion data RV1[6] of the inverse transition information data Tr2'[0:6] from the data inverse corrector 503 has the logic value '1', inverts the logics of all bits of the inverse transition information data Tr2'[0:6] and removes the inversion data RV1[6] from the inverse transition information data Tr2'[0:6]. Conversely, when the inversion data RV1[6] has the logic value '0', the data inverse inverter 502 maintains the logics of all the bits of the inverse transition information data Tr2'[0:6] as they are and removes the inversion data RV1[6] from the inverse transition information data Tr2'[0:6]. For example, in the case where the inverse transition information data Tr2'[0:6] is '0000010' as stated above, the inversion data RV1[6], which is the LSB of the inverse transition information data Tr2'[0:6], represents the logic value '0'. As a result, the data inverse inverter 502 maintains the logics of all the bits of the inverse transition information data Tr2'[0:6] as they are and removes the LSB, or inversion data RV1[6], from the inverse transition information data Tr2'[0:6]. Consequently, the resulting inverse transition information data Tr2[0:5] outputted from the data inverse inverter 502 is 6-bit data, '000001'.

The inverse transition information data Tr2[0:5] from the data inverse inverter 502 is supplied to the data restorer 501.

The data restorer 501 exclusive-NORs the currently supplied inverse transition information data Tr2[0:5] and image data supplied earlier than the above-stated second red image data R2[0:5] and having the same color information as that of the second red image data R2[0:5] and generates restored image data as a result of the exclusive-NORing. At this time, the image data supplied earlier than the second red image data R2[0:5] is red image data expressing the same color as that of the second red image data R2[0:5], which signifies the first red image data R1[0:5] in the first memory M1 as stated previously. The first red image data R1[0:5] in the first memory M1 is ultimately the same as the first red restored image data r1[0:5] in the fourth memory M4.

The data restorer 501 exclusive-NORs the inverse transition information data Tr2[0:5] and the first red restored image data r1[0:5] in the fourth memory M4 and generates second red restored image data r2[0:5] as a result of the exclusive-NORing. For example, because the inverse transition information data Tr2[0:5] from the data inverse inverter 502 is '000001' and the first red restored image data r1[0:5] in the fourth memory M4 is '011000', as stated previously, the second red restored image data r2[0:5] is '011001'. This second red restored image data r2[0:5] from the data restorer 501 is the same as the second red image data R2[0:5] supplied to the transition information generator 401.

This data restorer 501 supplies the second red restored image data r2[0:5] to the drive integrated circuit and also stores it in the fourth memory M4 to update the first red restored image data r1[0:5] previously stored in the fourth memory M4 with the second red restored image data r2[0:5]. As a result, the second red restored image data r2[0:5] is stored in the fourth memory M4 together with the first green restored image data g1[0:5] and first blue restored image data b1[0:5] after being outputted from the data restorer 501.

Thereafter, second green image data G2[0:5] is fifthly supplied to the timing controller TC subsequently to the second red image data R2[0:5]. The timing controller TC modulates the second green image data G2[0:5] in a similar manner to the above-stated second red image data R2[0:5].

Figure 5E:
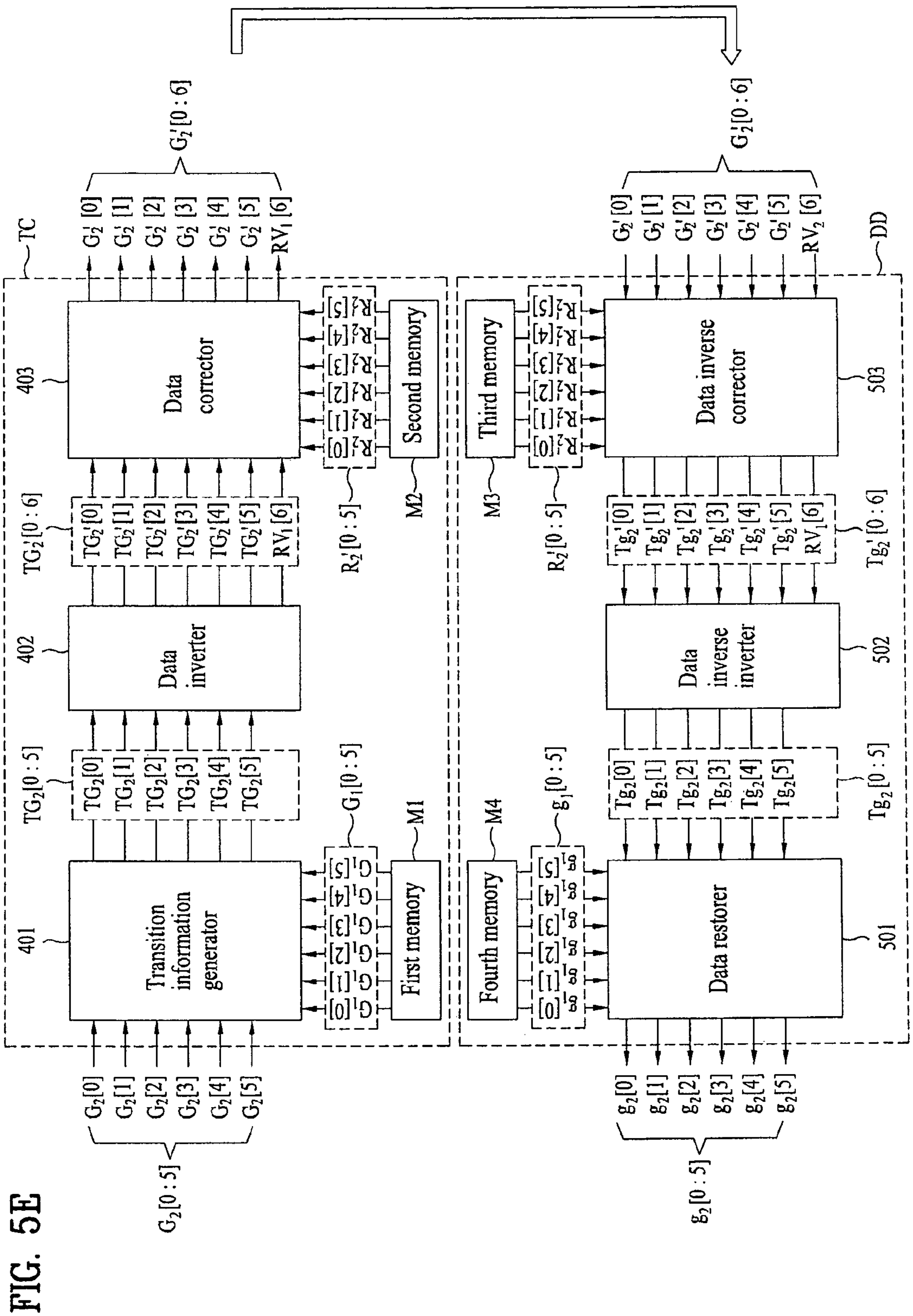

A process of modulating and restoring the second green image data G2[0:5] will hereinafter be described with reference to FIG. 5E.

The second green image data G2[0:5] fifthly inputted to the timing controller TC is modulated through the transition information generator 401, data inverter 402 and data corrector 403 included in the timing controller TC and then outputted from the timing controller TC.

That is, the second green image data G2[0:5] is supplied to the transition information generator 401 in the timing controller TC. The transition information generator 401 exclusive-NORs the currently supplied second green image data G2[0:5] and image data supplied earlier than the second green image data G2[0:5] and having the same color information as that of the second green image data G2[0:5] and generates transition information data TG2[0:5] as a result of the exclusive-NORing.

Accordingly, the transition information generator 401 exclusive-NORs the second green image data G2[0:5] and the first green image data G1[0:5] in the first memory M1 and generates the transition information data TG2[0:5] as a result of the exclusive-NORing.

For example, in the case where the second green image data G2[0:5] is 6-bit digital data, '111110', and the first green image data G1[0:5] is 6-bit digital data, '111100', the transition information data TG2[0:5] generated by the exclusive-NORing of those two data is 6-bit digital data, '000010'.

This transition information generator 401 supplies the transition information data TG2[0:5] to the data inverter 402 and also stores the second green image data G2[0:5] in the first memory M1 to update the first green image data G1[0:5] previously stored in the first memory M1 with the second green image data G2[0:5]. As a result, the second green image data G2[0:5] is stored in the first memory M1 together with the second red image data R2[0:5] and first blue image data B1 [0:5] after the transition information data TG2[0:5] is outputted from the transition information generator 401.

The data inverter 402 receives the transition information data TG2[0:5] from the transition information generator 401, checks the number of unit bits having the logic value '1' and the number of unit bits having the logic value '0', among the unit bits constituting the transition information data TG2[0:5], and, when it is determined based on the check result that the number of unit bits having the logic value '1' is larger than the number of unit bits having the logic value '0', inverts the logics of all the bits included in the transition information data TG2[0:5] and adds a unit bit of one bit having the logic value '1' to the inverted transition information data TG2[0:5] as the inversion data RV1[6] indicative of the inversion information. Conversely, when it is determined that the number of unit bits having the logic value '1' is equal to or smaller than the number of unit bits having the logic value '0', the data inverter 402 adds a unit bit of one bit having the logic value '0' to the transition information data TG2[0:5] as the inversion data RV1[6] under the condition of maintaining the transition information data TG2[0:5] as it is. For example, in the case where the transition information data TG2[0:5] is '000010' as stated above, the number of unit bits having the logic value '1' in the transition information data TG2[0:5] is one and the number of unit bits having the logic value '0' therein is five. As a result, because the number of unit bits having the logic value '1' is smaller than the number of unit bits having the logic value '0', this transition information data TG2[0:5] is not inverted. Also, the inversion data RV1[6] having the logic value '0' is added to the transition information data TG2[0:5] as a flag bit indicating that this transition information data TG2[0:5] has not been inverted. At this time, the inversion data RV1[6] becomes a least significant bit (LSB) of the resulting transition information data TG2'[0:6]. Consequently, the transition information data TG2[0:5] is increased in bit size by the added inversion data RV1[6]. For example, in the case where the transition information data TG2[0:5] is 6-bit data, '000010', as stated above, it is converted into 7-bit data, '0000100'. In this 7-bit transition information data TG2' [0:6], the high-order 6 bits represent information about a transition between the second green image data G2[0:5] and the first green image data G1[0:5], and the LSB represents inversion information.

The transition information data TG2'[0:6] with the inversion data RV1[6] added in this manner is supplied to the data corrector 403. This data corrector 403 exclusive-NORs corrected image data of image data outputted immediately before the second green image data G2[0:5] to be currently outputted and the transition information data TG2'[0:6] and generates corrected image data of the second green image data G2[0:5] as a result of the exclusive-NORing. That is, the data corrector 403 exclusive-NORs the transition information data TG2'[0:6] about the second green image data G2[0:5] and the second red corrected image data R2'[0:6] in the second memory M2 and generates second green corrected image data G2'[0:6] as a result of the exclusive-NORing. For example, because the transition information data TG2'[0:6] is '0000100' and the second red corrected image data R2'[0:6] is '0001100', as stated previously, the second green corrected image data G2'[0:6] is '0001000'. At this time, the inversion data RV1[6] '0' in the transition information data TG2'[0:6] is excluded from the operation and thus becomes an LSB of the second green corrected image data G2'[0:6] directly without being changed in logic value.

Also, the data corrector 403 outputs the second green corrected image data G2'[0:6] to the data driver DD and also stores it in the second memory M2 to update the second red corrected image data R2'[0:6] previously stored in the second memory M2 with the second green corrected image data G2'[0:6]. As a result, the second green corrected image data G2'[0:6] is stored in the second memory M2 after being outputted from the data corrector 403.

In conclusion, the timing controller TC modulates the second green image data G2[0:5] fifthly inputted thereto to generate the second green corrected image data G2'[0:6], and supplies the second green corrected image data G2'[0:6] to the data driver DD through the data transmission lines. At this time, the unit bits constituting the second green corrected image data G2'[0:6] are supplied to the data driver DD at a time through the same number of data transmission lines as that of the unit bits.

The data restoration circuit of the data driver DD inverse-transforms the second green corrected image data G2'[0:6] using the first green image data G1[0:5] and the second red corrected image data R2'[0:6] to restore the second green corrected image data G2'[0:6] to the original second green image data G2[0:5]. This restoration process will hereinafter be described in detail.

The data inverse corrector 503 exclusive-NORs the second green corrected image data G2'[0:6] currently supplied from the data corrector 403 and corrected image data supplied immediately before the second green corrected image data G2'[0:6] and generates inverse transition information data Tg2'[0:6] as a result of the exclusive-NORing. That is, the data inverse corrector 503 exclusive-NORs the second green corrected image data G2'[0:6] and the second red corrected image data R2'[0:6] in the third memory M3 and generates the inverse transition information data Tg2'[0:6] as a result of the exclusive-NORing. For example, because the second green corrected image data G2'[0:6] is '0001000' and the second red corrected image data R2'[0:6] is '000110', as stated previously, the inverse transition information data Tg2'[0:6] is '0000100'. At this time, the inversion data RV1[6], which is the LSB of the second green corrected image data G2'[0:6], is excluded from the operation and thus becomes an LSB of the inverse transition information data Tg2'[0:6] directly without being changed in logic value.

This data inverse corrector 503 supplies the inverse transition information data Tg2'[0:6] to the data inverse inverter 502 and also stores the second green corrected image data G2'[0:6] in the third memory M3 to update the second red corrected image data R2'[0:6] previously stored in the third memory M3 with the second green corrected image data G2'[0:6]. As a result, the second green corrected image data G2'[0:6] is stored in the third memory M3 after the inverse transition information data Tg2'[0:6] is outputted from the data inverse corrector 503.

The data inverse inverter 502, when the inversion data RV1[6] of the inverse transition information data Tg2'[0:6] from the data inverse corrector 503 has the logic value '1', inverts the logics of all bits of the inverse transition information data Tg2'[0:6] and removes the inversion data RV1[6] from the inverse transition information data Tg2'[0:6]. Conversely, when the inversion data RV1[6] has the logic value '0', the data inverse inverter 502 maintains the logics of all the bits of the inverse transition information data Tg2'[0:6] as they are and removes the inversion data RV1[6] from the inverse transition information data Tg2'[0:6]. For example, in the case where the inverse transition information data Tg2'[0:6] is '0000100' as stated above, the inversion data RV1[6], which is the LSB of the inverse transition information data Tg2'[0:6], represents the logic value '0'. As a result, the data inverse inverter 502 maintains the logics of all the bits of the inverse transition information data Tg2'[0:6] as they are and removes the LSB, or inversion data RV1[6], from the inverse transition information data Tg2'[0:6]. Consequently, the resulting inverse transition information data Tg2[0:5] outputted from the data inverse inverter 502 is 6-bit data, '000010'.

The inverse transition information data Tg2[0:5] from the data inverse inverter 502 is supplied to the data restorer 501. The data restorer 501 exclusive-NORs the currently supplied inverse transition information data Tg2[0:5] and image data supplied earlier than the above-stated second green image data G2[0:5] and having the same color information as that of the second green image data G2[0:5] and generates restored image data as a result of the exclusive-NORing. At this time, the image data supplied earlier than the second green image data G2[0:5] is green image data expressing the same color as that of the second green image data G2[0:5], which signifies the first green image data G1[0:5] in the first memory M1 as stated previously. The first green image data G1[0:5] in the first memory M1 is ultimately the same as the first green restored image data g1[0:5] in the fourth memory M4.

The data restorer 501 exclusive-NORs the inverse transition information data Tg2[0:5] and the first green restored image data g1[0:5] in the fourth memory M4 and generates second green restored image data g2[0:5] as a result of the exclusive-NORing. For example, because the inverse transition information data Tg2[0:5] from the data inverse inverter 502 is '000010' and the first green restored image data g1[0:5] in the fourth memory M4 is '111100', as stated previously, the second green restored image data g2[0:5] is '111110'. This second green restored image data g2[0:5] from the data restorer 501 is the same as the second green image data G2[0:5] supplied to the transition information generator 401.

This data restorer 501 supplies the second green restored image data g2[0:5] to the drive integrated circuit and also stores it in the fourth memory M4 to update the first green restored image data g1[0:5] previously stored in the fourth memory M4 with the second green restored image data g2[0:5]. As a result, the second green restored image data g2[0:5] is stored in the fourth memory M4 together with the second red restored image data r2[0:5] and first blue restored image data b1[0:5] after being outputted from the data restorer 501.

Thereafter, second blue image data B2[0:5] is sixthly supplied to the timing controller TC subsequently to the second green image data G2[0:5]. The timing controller TC modulates the second blue image data B2[0:5] in a similar manner to the above-stated second green image data G2[0:5].

Figure 5F:
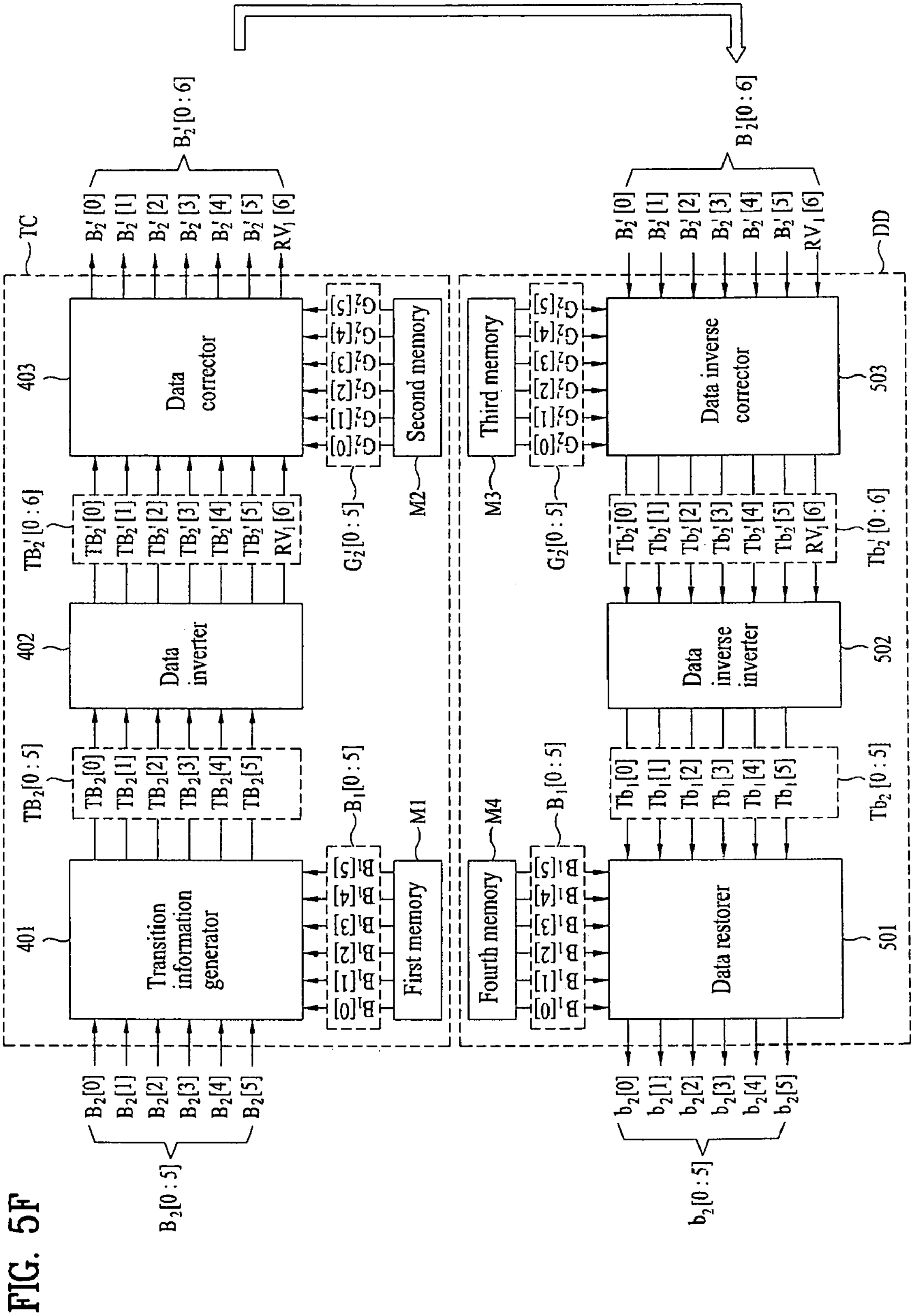

A process of modulating and restoring the second blue image data B2[0:5] will hereinafter be described with reference to FIG. 5F.

The second blue image data B2[0:5] sixthly inputted to the timing controller TC is modulated through the transition information generator 401, data inverter 402 and data corrector 403 included in the timing controller TC and then outputted from the timing controller TC.

That is, the second blue image data B2[0:5] is supplied to the transition information generator 401 in the timing controller TC. The transition information generator 401 exclusive-NORs the currently supplied second blue image data B2[0:5] and image data supplied earlier than the second blue image data B2[0:5] and having the same color information as that of the second blue image data B2[0:5] and generates transition information data TB2[0:5] as a result of the exclusive-NORing.

Accordingly, the transition information generator 401 exclusive-NORs the second blue image data B2[0:5] and the first blue image data B1[0:5] in the first memory M1 and generates the transition information data TB2[0:5] as a result of the exclusive-NORing.

For example, in the case where the second blue image data B2[0:5] is 6-bit digital data, '011101', and the first blue image data B1[0:5] is 6-bit digital data, '011100', the transition information data TB2[0:5] generated by the exclusive-NORing of those two data is 6-bit digital data, '000001'.

This transition information generator 401 supplies the transition information data TB2[0:5] to the data inverter 402 and also stores the second blue image data B2[0:5] in the first memory M1 to update the first blue image data B1[0:5] previously stored in the first memory M1 with the second blue image data B2[0:5]. As a result, the second blue image data B2[0:5] is stored in the first memory M1 together with the second red image data R2[0:5] and second green image data G2[0:5] after the transition information data TB2[0:5] is outputted from the transition information generator 401.

The data inverter 402 receives the transition information data TB2[0:5] from the transition information generator 401, checks the number of unit bits having the logic value '1' and the number of unit bits having the logic value '0', among the unit bits constituting the transition information data TB2[0:5], and, when it is determined based on the check result that the number of unit bits having the logic value '1' is larger than the number of unit bits having the logic value '0', inverts the logics of all the bits included in the transition information data TB2[0:5] and adds a unit bit of one bit having the logic value '1' to the inverted transition information data TB2[0:5] as the inversion data RV1[6] indicative of the inversion information. Conversely, when it is determined that the number of unit bits having the logic value '1' is equal to or smaller than the number of unit bits having the logic value '0', the data inverter 402 adds a unit bit of one bit having the logic value '0' to the transition information data TB2[0:5] as the inversion data RV1[6] under the condition of maintaining the transition information data TB2[0:5] as it is. For example, in the case where the transition information data TB2[0:5] is '000001' as stated above, the number of unit bits having the logic value '1' in the transition information data TB2[0:5] is one and the number of unit bits having the logic value '0' therein is five. As a result, because the number of unit bits having the logic value '1' is smaller than the number of unit bits having the logic value '0', this transition information data TB2[0:5] is not inverted. Also, the inversion data RV1[6] having the logic value '0' is added to the transition information data TB2[0:5] as a flag bit indicating that this transition information data TB2[0:5] has not been inverted. At this time, the inversion data RV1[6] becomes a least significant bit (LSB) of the resulting transition information data TB2'[0:6]. Consequently, the transition information data TB2[0:5] is increased in bit size by the added inversion data RV1[6]. For example, in the case where the transition information data TB2[0:5] is 6-bit data, '000001', as stated above, it is converted into 7-bit data, '0000010'. In this 7-bit transition information data TB2'[0:6], the high-order 6 bits represent information about a transition between the second blue image data B2[0:5] and the first blue image data B1[0:5], and the LSB represents inversion information.

The transition information data TB2'[0:6] with the inversion data RV1[6] added in this manner is supplied to the data corrector 403. This data corrector 403 exclusive-NORs corrected image data of image data outputted immediately before the second blue image data B2[0:5] to be currently outputted and the transition information data TB2'[0:6] and generates corrected image data of the second blue image data B2[0:5] as a result of the exclusive-NORing. That is, the data corrector 403 exclusive-NORs the transition information data TB2'[0:6] about the second blue image data B2[0:5] and the second green corrected image data G2'[0:6] in the second memory M2 and generates second blue corrected image data B2'[0:6] as a result of the exclusive-NORing. For example, because the transition information data TB2'[0:6] is '0000010' and the second green corrected image data G2'[0:6] is '000100', as stated previously, the second blue corrected image data B2'[0:6] is '0001010'. At this time, the inversion data RV1[6] '0' in the transition information data TB2'[0:6] is excluded from the operation and thus becomes an LSB of the second blue corrected image data B2'[0:6] directly without being changed in logic value.

Also, the data corrector 403 outputs the second blue corrected image data B2'[0:6] to the data driver DD and also stores it in the second memory M2 to update the second green corrected image data G2'[0:6] previously stored in the second memory M2 with the second blue corrected image data B2'[0:6]. As a result, the second blue corrected image data B2'[0:6] is stored in the second memory M2 after being outputted from the data corrector 403.

In conclusion, the timing controller TC modulates the second blue image data B2[0:5] sixthly inputted thereto to generate the second blue corrected image data B2'[0:6], and supplies the second blue corrected image data B2'[0:6] to the data driver DD through the data transmission lines. At this time, the unit bits constituting the second blue corrected image data B2'[0:6] are supplied to the data driver DD at a time through the same number of data transmission lines as that of the unit bits.

The data restoration circuit of the data driver DD inverse-transforms the second blue corrected image data B2'[0:6] using the first blue image data B1[0:5] and the second green corrected image data G2'[0:6] to restore the second blue corrected image data B2'[0:6] to the original second blue image data B2[0:5]. This restoration process will hereinafter be described in detail.

The data inverse corrector 503 exclusive-NORs the second blue corrected image data B2'[0:6] currently supplied from the data corrector 403 and corrected image data supplied immediately before the second blue corrected image data B2'[0:6] and generates inverse transition information data Tb2'[0:6] as a result of the exclusive-NORing. That is, the data inverse corrector 503 exclusive-NORs the second blue corrected image data B2'[0:6] and the second green corrected image data G2'[0:6] in the third memory M3 and generates the inverse transition information data Tb2'[0:6] as a result of the exclusive-NORing. For example, because the second blue corrected image data B2'[0:6] is '0001010' and the second green corrected image data G2'[0:6] is '000100', as stated previously, the inverse transition information data Tb2'[0:6] is '0000010'. At this time, the inversion data RV1[6], which is the LSB of the second blue corrected image data B2'[0:6], is excluded from the operation and thus becomes an LSB of the inverse transition information data Tb2'[0:6] directly without being changed in logic value.

This data inverse corrector 503 supplies the inverse transition information data Tb2'[0:6] to the data inverse inverter 502 and also stores the second blue corrected image data B2'[0:6] in the third memory M3 to update the second green corrected image data G2'[0:6] previously stored in the third memory M3 with the second blue corrected image data B2'

[0:6]. As a result, the second blue corrected image data B2' [0:6] is stored in the third memory M3 after the inverse transition information data Tb2'[0:6] is outputted from the data inverse corrector 503.

The data inverse inverter 502, when the inversion data RV1[6] of the inverse transition information data Tb2'[0:6] from the data inverse corrector 503 has the logic value '1', inverts the logics of all bits of the inverse transition information data Tb2'[0:6] and removes the inversion data RV1[6] from the inverse transition information data Tb2'[0:6]. Conversely, when the inversion data RV1[6] has the logic value '0', the data inverse inverter 502 maintains the logics of all the bits of the inverse transition information data Tb2'[0:6] as they are and removes the inversion data RV1[6] from the inverse transition information data Tb2'[0:6]. For example, in the case where the inverse transition information data Tb2'[0:6] is '0000010' as stated above, the inversion data RV1[6], which is the LSB of the inverse transition information data Tb2'[0:6], represents the logic value '0'. As a result, the data inverse inverter 502 maintains the logics of all the bits of the inverse transition information data Tb2'[0:6] as they are and removes the LSB, or inversion data RV1[6], from the inverse transition information data Tb2'[0:6]. Consequently, the resulting inverse transition information data Tb2[0:5] outputted from the data inverse inverter 502 is 6-bit data, '000001'.

The inverse transition information data Tb2[0:5] from the data inverse inverter 502 is supplied to the data restorer 501. The data restorer 501 exclusive-NORs the currently supplied inverse transition information data Tb2[0:5] and image data supplied earlier than the above-stated second blue image data B2[0:5] and having the same color information as that of the second blue image data B2[0:5] and generates restored image data as a result of the exclusive-NORing. At this time, the image data supplied earlier than the second blue image data B2[0:5] is blue image data expressing the same color as that of the second blue image data B2[0:5], which signifies the first blue image data B1[0:5] in the first memory M1 as stated previously. The first blue image data B1[0:5] in the first memory M1 is ultimately the same as the first blue restored image data b1[0:5] in the fourth memory M4.

The data restorer 501 exclusive-NORs the inverse transition information data Tb2[0:5] and the first blue restored image data b1[0:5] in the fourth memory M4 and generates second blue restored image data b2[0:5] as a result of the exclusive-NORing. For example, because the inverse transition information data Tb2[0:5] from the data inverse inverter 502 is '000001' and the first blue restored image data b1[0:5] in the fourth memory M4 is '011100', as stated previously, the second blue restored image data b2[0:5] is '011101'. This second blue restored image data b2[0:5] from the data restorer 501 is the same as the second blue image data B2[0:5] supplied to the transition information generator 401.

This data restorer 501 supplies the second blue restored image data b2[0:5] to the drive integrated circuit and also stores it in the fourth memory M4 to update the first blue restored image data b1[0:5] previously stored in the fourth memory M4 with the second blue restored image data b2[0:5]. As a result, the second blue restored image data b2[0:5] is stored in the fourth memory M4 together with the second red restored image data r2[0:5] and second green restored image data g2[0:5] after being outputted from the data restorer 501.

In this manner, the data transition minimization circuit according to the present embodiment exclusive-NORs nth image data with (n−3)th image data having the same color information as that of the nth image data to generate transition information data, determines a logic value of inversion data of the transition information data based on a characteristic of the transition information data, and exclusive-NORs the resulting transition information data with corrected image data of (n−1)th image data to generate corrected image data of the nth image data. Then, the data transition minimization circuit exclusive-NORs the corrected image data of the nth image data with the corrected image data of the (n−1)th image data to generate inverse transition information data, determines whether to invert the inverse transition information data, based on inversion data of the inverse transition information data, and exclusive-NORs the resulting inverse transition information data with the (n−1)th image data to generate restored image data that is the same as the nth image data.

In accordance with an embodiment of the invention, it is possible to, based on a characteristic that little transition occurs between image data located in adjacent unit pixels and having the same color information, perform a comparison between those image data, generate transition information data based on the comparison result and modulate and restore image data to be currently outputted, based on the generated transition information data, so as to minimize a transition between image data which are transmitted from the timing controller TC to the data driver DD.

Figure 6:
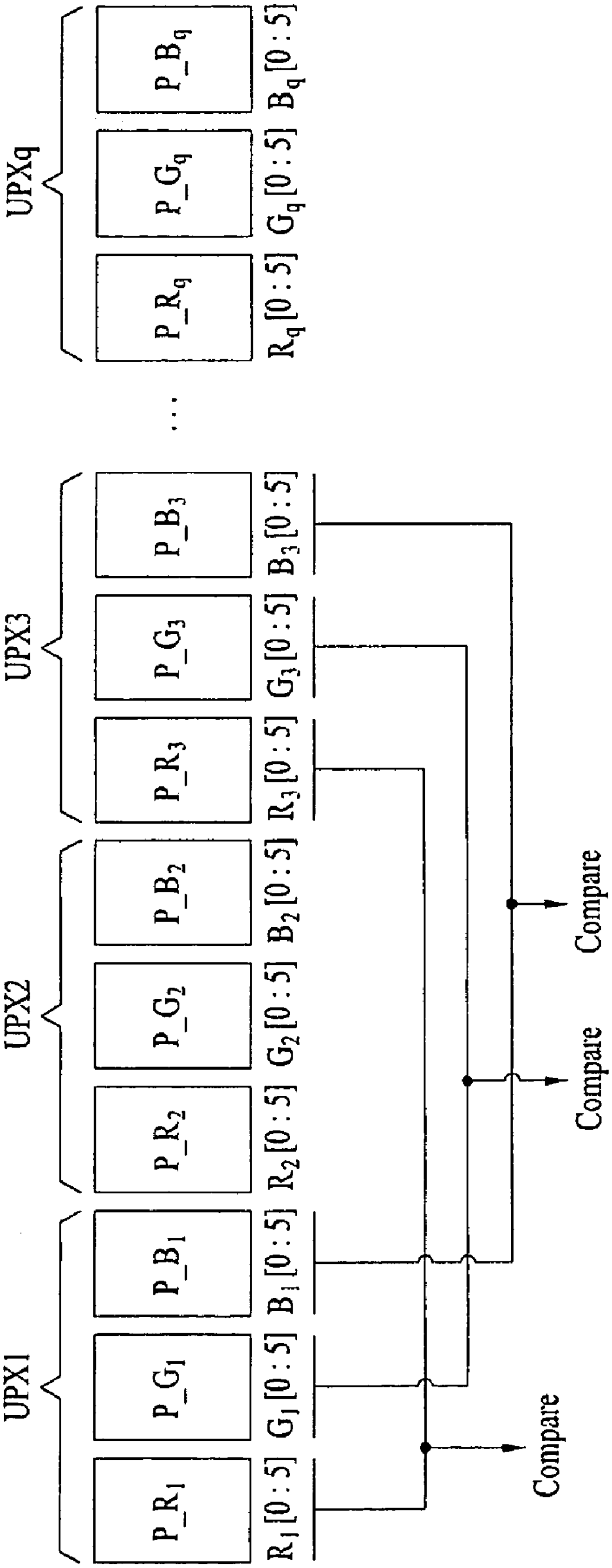
FIG. 6 shows exemplary comparison relations between pixel cells of one horizontal line connected in common to the arbitrary gate line in FIG. 1 according to another embodiment of the invention.

FIG. 6 shows exemplary comparison relations between pixel cells of one horizontal line connected in common to the arbitrary gate line in FIG. 1 according to another embodiment of the invention. As illustrated in FIG. 6, image data corresponding to an nth pixel cell is compared with image data corresponding to an (n−6)th pixel cell and then modulated according to the comparison result. For example, third red image data R3[0:5] corresponding to a third red pixel cell P_R3 in a third unit pixel UPX3 is compared with first red image data R1[0:5] corresponding to a first red pixel cell P_R1 in a first unit pixel UPX1 and then modulated according to the comparison result.

In embodiments of the invention, the method of FIG. 3 and the method of FIG. 6 may be used in combination.

As apparent from the above description, the data transition minimization method and data transition minimization circuit according to an embodiment of the invention have effects as follows.

It is possible to, based on a characteristic that little transition occurs between image data having the same color information, perform a comparison between those image data, generate transition information data based on the comparison result and modulate and restore image data to be currently outputted, based on the generated transition information data, so as to minimize a transition between image data which are transmitted from a timing controller to a data driver.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A data transition minimization method, comprising:

exclusive-NORing inputted nth image data (where n is a natural number) and (n−m)th image data (where m is a natural number smaller than n) expressing the same color as that of the nth image data to generate transition information data;

generating inversion data indicative of inversion information by inverting all bits included in the transition information data and adding a unit bit having the logic value '1' to the inverted transition information data when the number of unit bits having a logic value '1' in the transition information data is larger than the number of unit bits having a logic value '0' in the transition information data, and adding a unit bit having the logic value '0' to the transition information data when the number of unit bits having the logic value '1' in the transition information data is equal to or smaller than the number of unit bits having the logic value '0' in the transition information data;

exclusive-NORing the transition information data with the inversion data added and corrected image data of (n−1) th image data to generate corrected image data of the nth image data, and supplying the generated corrected image data to a data driver through data transmission lines; and restoring the corrected image data supplied to the data driver to restored image data corresponding to the original nth image data.

2. The data transition minimization method according to claim 1, wherein the restoring of the corrected image includes restoring the corrected image data of the nth image data to the nth image data using the corrected image data of the nth image data, the (n−1)th image data and the corrected image data of the (n−1)th image data.

3. The data transition minimization method according to claim 2, wherein the restoring of the corrected image includes:

exclusive-NORing the corrected image data supplied at the step c) and the corrected image data of the (n−1)th image data to generate inverse transition information data;

when inversion data of the inverse transition information data has the logic value '1', inverting logics of all bits of the inverse transition information data and removing the inversion data from the inverse transition information data, and, when the inversion data has the logic value '0', maintaining the logics of all the bits of the inverse transition information data as they are and removing the inversion data from the inverse transition information data; and exclusive-NORing the resulting inverse transition information data at the step f) and the (n−m)th image data to restore the restored image data corresponding to the original nth image data.

4. The data transition minimization method according to claim 1, wherein the image data is any one of red image data having information about a red image, green image data having information about a green image and blue image data having information about a blue image.

5. The data transition minimization method according to claim 4, wherein:

the image data is outputted in the order of red image data, green image data and blue image data and sequentially supplied to the data driver; and the m is a multiple of 3.

6. A data transition minimization circuit, comprising:

a transition information generator for exclusive-NORing inputted nth image data (where n is a natural number) and (n−m)th image data (where m is a natural number smaller than n) expressing the same color as that of the nth image data to generate transition information data;

a data inverter for, when the number of unit bits having a logic value '1' included in the transition information data from the transition information generator is larger than the number of unit bits having a logic value '0' included in the transition information data, inverting logics of all bits included in the transition information data and adding a unit bit having the logic value '1' to the inverted transition information data as inversion data indicative of inversion information, and, when the number of unit bits having the logic value '1' included in the transition information data is equal to smaller than the number of unit bits having the logic value '0' included in the transition information data, adding a unit bit having the logic value '0' to the transition information data as the inversion data;

a data corrector for exclusive-NORing the resulting transition information data from the data inverter and corrected image data of (n−1)th image data to generate corrected image data of the nth image data, and supplying the generated corrected image data through data transmission lines; and a data driver for restoring the corrected image data, supplied from the data corrector through the data transmission lines, to restored image data corresponding to the original nth image data.

7. The data transition minimization circuit according to claim 6, wherein the data driver comprises a data restoration circuit, the data restoration circuit comprising:

a data inverse corrector for exclusive-NORing the corrected image data from the data corrector and the corrected image data of the (n−1)th image data to generate inverse transition information data;

a data inverse inverter for, when inversion data of the inverse transition information data from the data inverse corrector has the logic value '1', inverting logics of all bits of the inverse transition information data and removing the inversion data from the inverse transition information data, and, when the inversion data has the logic value '0', maintaining the logics of all the bits of the inverse transition information data as they are and removing the inversion data from the inverse transition information data; and a data restorer for exclusive-NORing the resulting inverse transition information data from the data inverse inverter and the (n−m)th image data to restore the restored image data corresponding to the original nth image data.

8. The data transition minimization circuit according to claim 7, further comprising:

a first memory for storing the (n−m)th image data and supplying the (n−m)th image data to the transition information generator;

a second memory for storing the corrected image data of the (n−1)th image data and supplying the corrected image data of the (n−1)th image data to the data corrector;

a third memory for storing the corrected image data of the (n−1)th image data and supplying the corrected image data of the (n−1)th image data to the data inverse corrector; and a fourth memory for storing the (n−m)th image data and supplying the (n−m)th image data to the data restorer.

* * * * *